US012738919B2

(12) United States Patent
Kimura et al.

(10) Patent No.: US 12,738,919 B2
(45) Date of Patent: Sep. 15, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Katsumi Suzuki, Nagaokakyo (JP); Toshimaro Yoneda, Nagaokakyo (JP); Kazunori Inoue, Nagaokakyo (JP); Naohiro Nodake, Nagaokakyo (JP); Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 721 days.

(21) Appl. No.: 18/195,432

(22) Filed: May 10, 2023

(65) Prior Publication Data

US 2023/0275555 A1 Aug. 31, 2023

Related U.S. Application Data

(63) Continuation of application No. PCT/JP2021/041596, filed on Nov. 11, 2021.

(Continued)

(51) Int. Cl.

*H03H 9/00* (2006.01)
*H03H 9/02* (2006.01)

(Continued)

(52) U.S. Cl.

CPC .... *H03H 9/02133* (2013.01); *H03H 9/02031* (2013.01); *H03H 9/02102* (2013.01);

(Continued)

(58) Field of Classification Search

CPC ........... H03H 9/02133; H03H 9/02031; H03H 9/02102; H03H 9/02228; H03H 9/13;

(Continued)

(56) References Cited

U.S. PATENT DOCUMENTS

2013/0234805 A1 9/2013 Takahashi
2014/0152145 A1 6/2014 Kando et al.
2017/0187352 A1* 6/2017 Omura .................... H03H 9/25
2020/0204146 A1 6/2020 Watanabe et al.
2024/0048115 A1* 2/2024 Inoue ...................... H03H 3/02

FOREIGN PATENT DOCUMENTS

CN 111355468 A 6/2020
JP 2012257019 A 12/2012

(Continued)

OTHER PUBLICATIONS

International Search Report in PCT/JP2021/041596, mailed Feb. 1, 2022, 3 pages.

(Continued)

*Primary Examiner* — Julio C. Gonzalez
(74) *Attorney, Agent, or Firm* — Keating & Bennett, LLP

(57) ABSTRACT

An acoustic wave device includes a support substrate having a thickness in a first direction, a piezoelectric layer on the support substrate, an interdigital transducer electrode on the piezoelectric layer and including first and second electrode fingers, the first electrode fingers extending in a second direction crossing the first direction, the second electrode fingers extending in the second direction and facing the first electrode fingers in a third direction orthogonal or substantially orthogonal to the second direction, and a reinforcing film on the piezoelectric layer. The support substrate and the piezoelectric layer include a hollow therebetween at a position overlapping the interdigital transducer electrode in the first direction. At least one through hole penetrates the piezoelectric layer at a position not overlapping the interdigital transducer electrode in the first direction, and the through hole communicates with the hollow. The reinforcing film overlaps the hollow in the first direction.

25 Claims, 30 Drawing Sheets

Related U.S. Application Data

(60) Provisional application No. 63/113,214, filed on Nov. 13, 2020.

(51) Int. Cl.
*H03H 9/13* (2006.01)
*H03H 9/17* (2006.01)

(52) U.S. Cl.
CPC .......... *H03H 9/02228* (2013.01); *H03H 9/13* (2013.01); *H03H 9/174* (2013.01); *H03H 9/176* (2013.01)

(58) Field of Classification Search
CPC .... H03H 9/174; H03H 9/176; H03H 9/02015; H03H 9/02157; H03H 9/173; H03H 9/132; H03H 9/02897
See application file for complete search history.

(56) References Cited

FOREIGN PATENT DOCUMENTS

| | | | |
|---|---|---|---|
| JP | 2013214954 | A | 10/2013 |
| WO | 2012073871 | A1 | 6/2012 |
| WO | 2016052129 | A1 | 4/2016 |
| WO | 2016147687 | A1 | 9/2016 |

OTHER PUBLICATIONS

Written Opinion in PCT/JP2021/041596, mailed Feb. 1, 2022, 3 pages.

Official Communication issued in corresponding Chinese Patent Application No. 202180075923.1, mailed on Jun. 22, 2026, 7 pages.

* cited by examiner

ACOUSTIC WAVE DEVICE

CROSS REFERENCE TO RELATED APPLICATIONS

This application claims the benefit of priority to Provisional Application No. 63/113,214 filed on Nov. 13, 2020 and is a Continuation Application of PCT Application No. PCT/JP2021/041596 filed on Nov. 11, 2021. The entire contents of each application are hereby incorporated herein by reference.

BACKGROUND OF THE INVENTION

1. Field of the Invention

The present invention relates to an acoustic wave device.

2. Description of the Related Art

An acoustic wave device is disclosed in Japanese Unexamined Patent Application Publication No. 2012-257019.

With a hollow between a support substrate and a piezoelectric layer in the technique disclosed in Japanese Unexamined Patent Application Publication No. 2012-257019, spurious emission may cause the occurrence of cracks in the piezoelectric layer. It is necessary to prevent the occurrence of cracks in the piezoelectric layer.

SUMMARY OF THE INVENTION

Preferred embodiments of the present invention provide acoustic wave devices in each of which the occurrence of cracks in a piezoelectric layer is able to be prevented.

An acoustic wave device according to a preferred embodiment of the preset invention includes a support substrate having a thickness in a first direction, a piezoelectric layer on the support substrate, an interdigital transducer electrode on the piezoelectric layer and including a plurality of first electrode fingers and a plurality of second electrode fingers, the plurality of first electrode fingers extending in a second direction crossing the first direction, the plurality of second electrode fingers extending in the second direction and facing corresponding ones of the plurality of first electrode fingers in a third direction orthogonal or substantially orthogonal to the second direction, and a reinforcing film provided in the first direction of the piezoelectric layer. The support substrate and the piezoelectric layer include a hollow therebetween at a position at least partially overlapping the interdigital transducer electrode in the first direction. At least one through hole penetrates the piezoelectric layer at a position not overlapping the interdigital transducer electrode in the first direction. The through hole communicates with the hollow. The reinforcing film at least partially overlaps the hollow in the first direction.

Preferred embodiments of the present invention are able to prevent the occurrence of cracks in the piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail below with reference to the drawings. The preferred embodiments described below do not limit the present invention. The preferred embodiments of the present invention are presented for illustrative purposes. In modifications and a second preferred embodiment of the present invention in which some components of different preferred embodiments can be replaced or combined, the description of matters common to the first preferred embodiment will be omitted and differences will primarily be described. In particular, the same or substantially the same advantageous effects achieved by the same or corresponding configurations will not be described in the description of each preferred embodiment.

First Preferred Embodiment

Figure 1A:
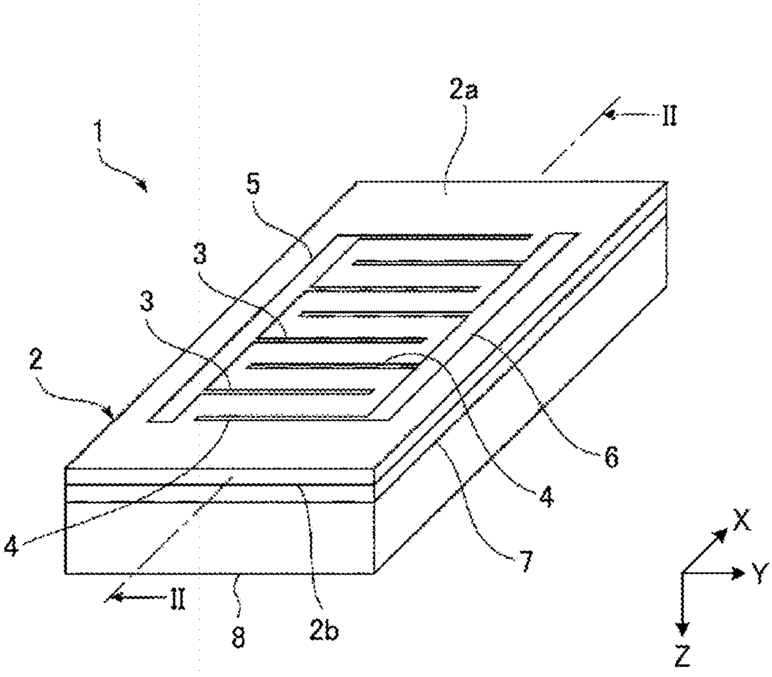
FIG. 1A is a perspective view of an acoustic wave device according to a first preferred embodiment of the present invention.
Figure 1B:
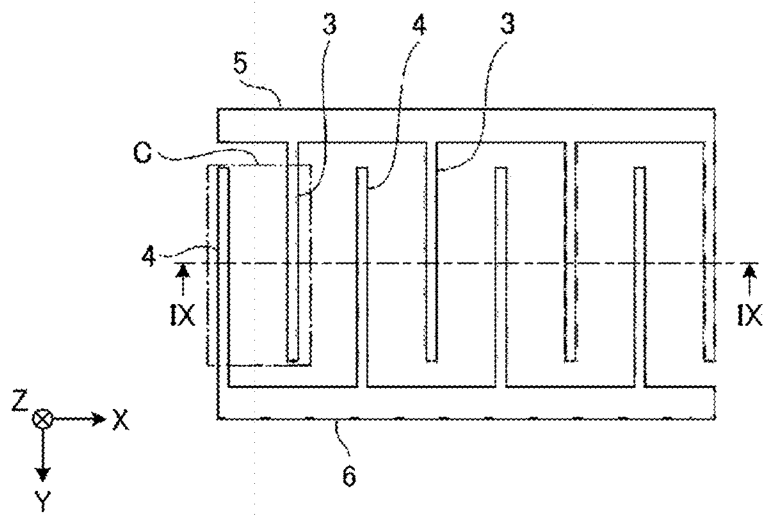
FIG. 1B is a plan view of an electrode structure according to the first preferred embodiment of the present invention.

FIG. 1A is a perspective view of an acoustic wave device according to a first preferred embodiment of the present invention. FIG. 1B is a plan view of an electrode structure according to the first preferred embodiment.

An acoustic wave device 1 according to the first preferred embodiment includes a piezoelectric layer 2 made of, for example, $LiNbO_3$. The piezoelectric layer 2 may be made of, for example, $LiTaO_3$. The cut-angles of $LiNbO_3$ and $LiTaO_3$ are Z-cut in the first preferred embodiment. The cut-angles of $LiNbO_3$ and $LiTaO_3$ may be rotated Y-cut or X-cut. It is preferable that the propagation orientation is Y-propagation and X-propagation±about 30°, for example.

The thickness of the piezoelectric layer 2 is not particularly limited. For effective excitation of first-order thickness shear mode, the thickness of the piezoelectric layer 2 is preferably, for example, greater than or equal to about 50 nm and less than or equal to about 1000 nm.

The piezoelectric layer 2 includes a first principal surface 2*a* and a second principal surface 2*b* opposite each other in the Z direction. Electrode fingers 3 and 4 are provided on the first principal surface 2*a*.

Here, the electrode finger 3 is an example of "first electrode finger", and the electrode finger 4 is an example of "second electrode finger". In FIG. 1A and FIG. 1B, a plurality of electrode fingers 3 are connected to a first busbar 5, and a plurality of electrode fingers 4 are connected to a second busbar 6. The plurality of electrode fingers 3 and the plurality of electrode fingers 4 are interdigitated with each other. The electrode fingers 3 and the electrode fingers 4 thus define an interdigital transducer electrode.

The electrode fingers 3 and 4 are rectangular or substantially rectangular in shape and have a length direction. In a direction orthogonal or substantially orthogonal to the length direction, adjacent ones of the electrode fingers 3 and 4 face each other. Both the length direction of the electrode fingers 3 and 4 and the direction orthogonal or substantially orthogonal to the length direction of the electrode fingers 3 and 4 are directions that cross the thickness direction of the piezoelectric layer 2. Therefore, adjacent ones of the electrode fingers 3 and 4 can also be considered to face each other in the direction crossing the thickness direction of the piezoelectric layer 2. Hereinafter, the thickness direction of the piezoelectric layer 2 may be described as a Z direction (or first direction), the length direction of the electrode fingers 3 and 4 may be described as a Y direction (or second direction), and the direction orthogonal or substantially orthogonal to the electrode fingers 3 and 4 may be described as an X direction (or third direction).

The length direction of the electrode fingers 3 and 4 may be interchanged with the direction orthogonal or substantially orthogonal to the length direction of the electrode fingers 3 and 4 illustrated in FIG. 1A and FIG. 1B. That is, the electrode fingers 3 and 4 may extend in the direction in which the first busbar 5 and the second busbar 6 extend in FIGS. 1A and 1B. In this case, the first busbar 5 and the second busbar 6 extend in the direction in which the electrode fingers 3 and 4 extend in FIGS. 1A and 1B. A plurality of pairs of adjacent electrode fingers 3 and 4, the electrode finger 3 being connected to one potential and the electrode finger 4 being connected to the other potential, are arranged in the direction orthogonal or substantially orthogonal to the length direction of the electrode fingers 3 and 4.

Here, the electrode fingers 3 and 4 adjacent to each other are not in direct contact, but are spaced apart from each other. The electrode fingers 3 and 4 adjacent to each other are not provided with other electrodes (including other electrode fingers 3 and 4) connected to hot and ground electrodes therebetween. The number of pairs of adjacent electrode fingers 3 and 4 does not necessarily need to be an integer, and there may be, for example, 1.5 pairs or 2.5 pairs.

A center-to-center distance, or pitch, between the electrode fingers 3 and 4 is preferably, for example, greater than or equal to about 1 μm and less than or equal to about 10 μm. The center-to-center distance between the electrode fingers 3 and 4 is a distance from the center of the width dimension of the electrode finger 3 in the direction orthogonal or substantially orthogonal to the length direction of the electrode finger 3 to the center of the width dimension of the electrode finger 4 in the direction orthogonal to the length direction of the electrode finger 4.

When the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance between the electrode fingers 3 and 4 is the average of the center-to-center distances between adjacent ones of the greater than or equal to 1.5 pairs of electrode fingers 3 and 4.

The width of the electrode fingers 3 and 4, or the dimension of the electrode fingers 3 and 4 in the direction in which the electrode fingers 3 and 4 face each other, is preferably, for example, greater than or equal to about 150 nm and less than or equal to about 1000 nm. The center-to-center distance between the electrode fingers 3 and 4 is a distance from the center of the dimension (width dimension) of the electrode finger 3 in the direction orthogonal or substantially orthogonal to the length direction of the electrode finger 3 to the center of the dimension (width dimension) of the electrode finger 4 in the direction orthogonal to the length direction of the electrode finger 4.

In the first preferred embodiment, where a Z-cut piezoelectric layer is used, the direction orthogonal or substantially orthogonal to the length direction of the electrode fingers 3 and 4 is a direction orthogonal or substantially orthogonal to the polarization direction of the piezoelectric layer 2. This is not applicable when a piezoelectric body with other cut-angles is used as the piezoelectric layer 2. Here, the term "orthogonal" may refer not only to being exactly orthogonal, but also to being substantially orthogonal (e.g., the angle between the direction orthogonal to the length direction of the electrode fingers 3 and 4 and the polarization direction is about 90°±10°).

Figure 2:
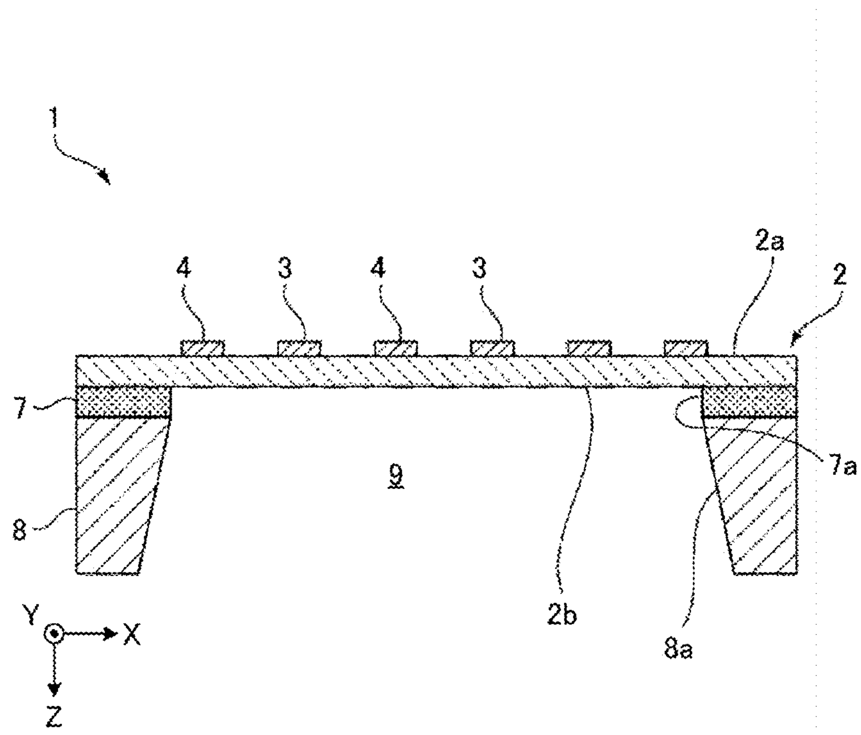
FIG. 2 is a cross-sectional view taken along line II-II of FIG. 1A.

A support substrate 8 is disposed adjacent to the second principal surface 2*b* of the piezoelectric layer 2, with a dielectric film 7 interposed therebetween. The dielectric film 7 and the support substrate 8 have a frame shape. As illustrated in FIG. 2, the dielectric film 7 and the support substrate 8 include cavities 7*a* and 8*a*, respectively, which define a hollow (air gap) 9.

The hollow 9 is provided to allow vibration of an excitation region C of the piezoelectric layer 2. Therefore, the support substrate 8 is disposed adjacent to the second principal surface 2*b*, with the dielectric film 7 interposed therebetween, so as not to overlap at least one pair of electrode fingers 3 and 4. The dielectric film 7 is optional. That is, the support substrate 8 may be disposed on the second principal surface 2*b* of the piezoelectric layer 2, either directly or indirectly.

The dielectric film 7 is made of, for example, silicon oxide. The dielectric film 7 can be made of an appropriate insulating material, such as, for example, silicon nitride or alumina, other than silicon oxide.

The support substrate 8 is made of, for example, Si. The plane orientation of the Si substrate on the surface thereof adjacent to the piezoelectric layer 2 may be (100), (110), or (111). It is preferable that the Si is a high-resistance Si with a resistivity of greater than or equal to about 4 kΩ, for example. The support substrate 8 can also be made of an appropriate insulating material or semiconductor material. Examples of the material used to form the support substrate 8 include piezoelectric materials, such as aluminum oxide, lithium tantalate, lithium niobate, and crystals, various ceramics, such as alumina, magnesia, sapphire, silicon nitride, aluminum nitride, silicon carbide, zirconia, cordierite, mullite, steatite, and forsterite, dielectrics, such as diamond and glass, and a semiconductor, such as gallium nitride.

The plurality of electrode fingers 3 and 4, the first busbar 5, and the second busbar 6 are made of an appropriate metal, such as, for example, Al, or an appropriate alloy, such as AlCu alloy. In the first preferred embodiment, the electrode fingers 3 and 4, the first busbar 5, and the second busbar 6 have a multilayer structure including, for example, a Ti film and an Al film on the Ti film. The Ti film may be replaced by a different adhesion layer.

To drive the acoustic wave device 1, an alternating-current voltage is applied between the plurality of electrode fingers 3 and the plurality of electrode fingers 4. More specifically, an alternating-current voltage is applied between the first busbar 5 and the second busbar 6. This can produce resonance characteristics using first-order thickness shear mode bulk waves excited in the piezoelectric layer 2.

In the acoustic wave device 1, d/p is, for example, less than or equal to about 0.5, where d is the thickness of the piezoelectric layer 2 and p is the center-to-center distance between any adjacent electrode fingers 3 and 4 of the plurality of pairs of electrode fingers 3 and 4. This allows effective excitation of the first-order thickness shear mode bulk waves and can produce good resonance characteristics. It is more preferable that d/p is, for example, less than or equal to about 0.24. This produces better resonance characteristics.

As in the first preferred embodiment, when the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance p between the adjacent electrode fingers 3 and 4 is the average center-to-center distance between all adjacent electrode fingers 3 and 4.

In the acoustic wave device 1 of the first preferred embodiment configured as described above, the Q factor does not decrease easily even if the number of pairs of the electrode fingers 3 and 4 is reduced for the purpose of size reduction. This is because the acoustic wave device 1 is a resonator that does not require reflectors on both sides, and thus does not suffer significant propagation loss. The acoustic wave device 1 does not require reflectors, because it uses first-order thickness shear mode bulk waves.

Figure 3A:
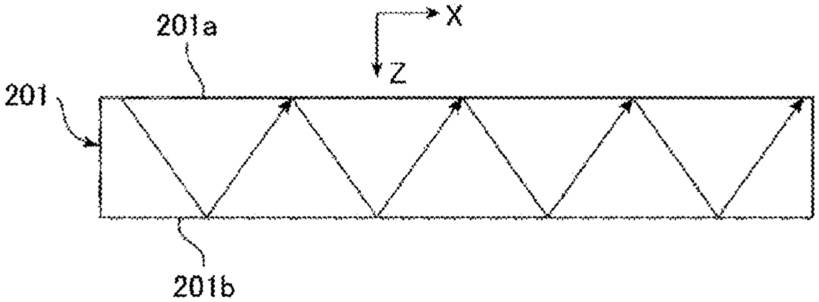
FIG. 3A is a schematic cross-sectional view for explaining Lamb waves propagating in a piezoelectric layer of a comparative example.
Figure 3B:
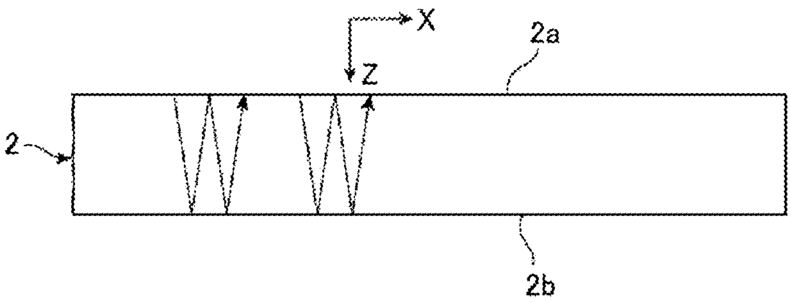
FIG. 3B is a schematic cross-sectional view for explaining first-order thickness shear mode bulk waves propagating in a piezoelectric layer of the first preferred embodiment of the present invention.
Figure 4:
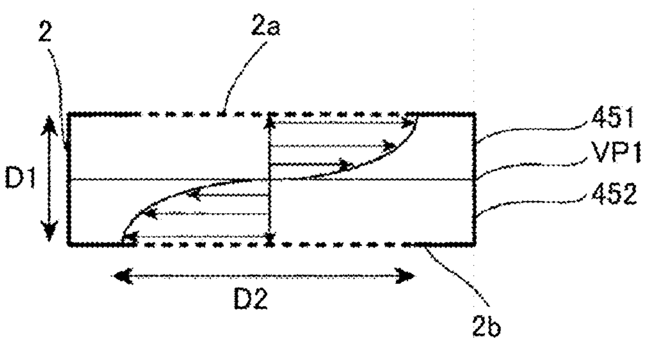
FIG. 4 is a schematic cross-sectional view for explaining an amplitude direction of first-order thickness shear mode bulk waves propagating in the piezoelectric layer of the first preferred embodiment of the present invention.

FIG. 3A is a schematic cross-sectional view for explaining Lamb waves propagating in a piezoelectric layer of a comparative example. FIG. 3B is a schematic cross-sectional view for explaining first-order thickness shear mode bulk waves propagating in the piezoelectric layer of the first preferred embodiment. FIG. 4 is a schematic cross-sectional view for explaining an amplitude direction of first-order thickness shear mode bulk waves propagating in the piezoelectric layer of the first preferred embodiment.

FIG. 3A illustrates Lamb waves propagating in a piezoelectric layer of an acoustic wave device, such as that described in Japanese Unexamined Patent Application Publication No. 2012-257019. As illustrated in FIG. 3A, the waves propagate in a piezoelectric layer 201 as indicated by arrows. The piezoelectric layer 201 includes a first principal surface 201*a* and a second principal surface 201*b*. A thickness direction, which connects the first principal surface 201*a* and the second principal surface 201*b*, is the Z direction. The X direction is a direction in which the electrode fingers 3 and 4 of the interdigital transducer electrode are arranged. The Lamb waves propagate in the X direction, as illustrated in FIG. 3A. Although the entire piezoelectric layer 201 vibrates, the Lamb waves (plate waves) propagate in the X direction. Reflectors are thus provided on both sides to produce resonance characteristics. This causes wave propagation loss and results in a low Q factor when the number of pairs of the electrode fingers 3 and 4 is reduced for size reduction.

In the acoustic wave device of the first preferred embodiment, as illustrated in FIG. 3B, vibration displacement occurs in the thickness shear direction. Therefore, the waves propagate substantially in the direction connecting the first principal surface 2*a* and the second principal surface 2*b* of the piezoelectric layer 2, that is, substantially in the Z direction and resonate. In other words, the X direction component of the waves is much smaller than the Z direction component of the waves. Since the wave propagation in the Z direction produces resonance characteristics, the acoustic wave device requires no reflectors. This prevents propagation loss that occurs during propagation to reflectors. Therefore, the Q factor does not decrease easily even if the number of electrode pairs, each including the electrode fingers 3 and 4, is reduced for the purpose of size reduction.

As illustrated in FIG. 4, the amplitude direction of first-order thickness shear mode bulk waves in a first region 451 included in the excitation region C (see FIG. 1B) of the piezoelectric layer 2 is opposite that in a second region 452 included in the excitation region C. FIG. 4 schematically illustrates how bulk waves behave when a voltage that makes the potential of the electrode finger 4 higher than that of the electrode finger 3 is applied between the electrode fingers 3 and 4. In the excitation region C, the first region 451 is a region between a virtual plane VP1 and the first principal surface 2*a*, and the second region 452 is a region between the virtual plane VP1 and the second principal surface 2*b*. The virtual plane VP1 is orthogonal or substantially orthogonal to the thickness direction of the piezoelectric layer 2 and divides the piezoelectric layer 2 into two.

The acoustic wave device 1 includes at least one electrode pair including the electrode fingers 3 and 4. Since the acoustic wave device 1 is not configured to propagate waves in the X direction, it is not necessarily required that there be more than one electrode pair including the electrode fingers 3 and 4. That is, the acoustic wave device 1 simply requires at least one electrode pair.

For example, the electrode finger 3 is an electrode connected to the hot potential, and the electrode finger 4 is an electrode connected to the ground potential. Alternatively, the electrode finger 3 and the electrode finger 4 may be connected to the ground potential and the hot potential, respectively. In the first preferred embodiment, the at least one electrode pair is a combination of electrodes, one connected to the hot potential and the other connected to the ground potential, as described above, and no floating electrode is provided.

Figure 5:
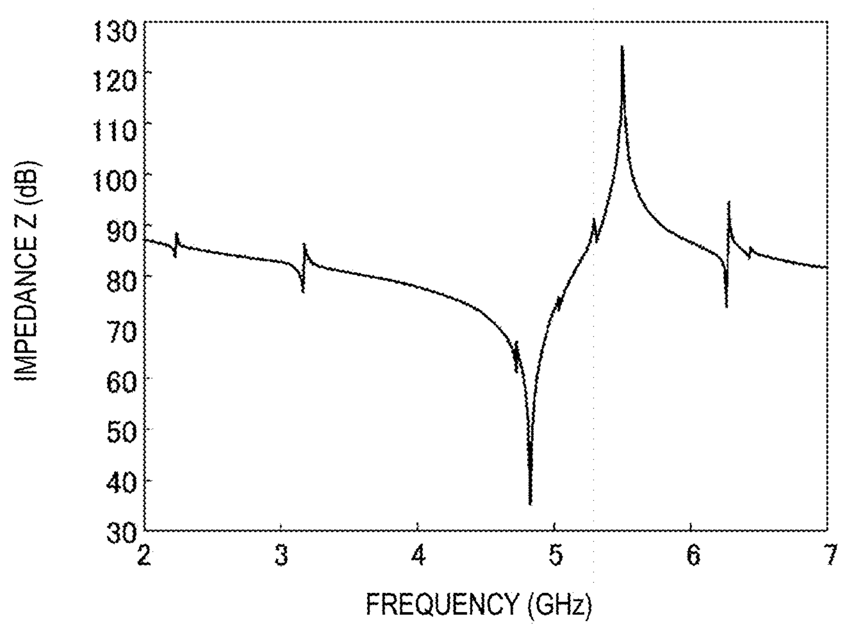
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device according to the first preferred embodiment. The design parameters of the acoustic wave device 1 having the resonance characteristics illustrated in FIG. 5 are as follows.

Piezoelectric layer 2: $LiNbO_3$ with Euler angles (about 0°, about 0°, about 90°)

Thickness of piezoelectric layer 2: about 400 nm

Length of excitation region C (see FIG. 1B): about 40 μm

Number of electrode pairs, each consisting of electrode fingers 3 and 4: 21 pairs Center-to-center distance (pitch) between electrode fingers 3 and 4: about 3 μm Width of electrode fingers 3 and 4: about 500 nm d/p: about 0.133

Dielectric film 7: about 1 μm-thick silicon oxide film

Support substrate 8: Si

The excitation region C (see FIG. 1B) is a region where the electrode fingers 3 and 4 overlap, as viewed in the X direction orthogonal or substantially orthogonal to the length direction of the electrode fingers 3 and 4. The length of the excitation region C is a dimension of the excitation region C along the length direction of the electrode fingers 3 and 4.

In the first preferred embodiment, all of the electrode pairs, each include the electrode fingers 3 and 4, have the same or substantially the same interelectrode distance. That is, the electrode fingers 3 and 4 are arranged with an equal or substantially equal pitch.

As shown in FIG. 5, good resonance characteristics with a fractional bandwidth of about 12.5% are obtained without reflectors.

In the first preferred embodiment, d/p is, for example, less than or equal to about 0.5 and more preferably less than or equal to about 0.24, where d is the thickness of the piezoelectric layer 2 and p is the center-to-center distance between the electrode fingers 3 and 4. This will now be described with reference to FIG. 6.

Figure 6:
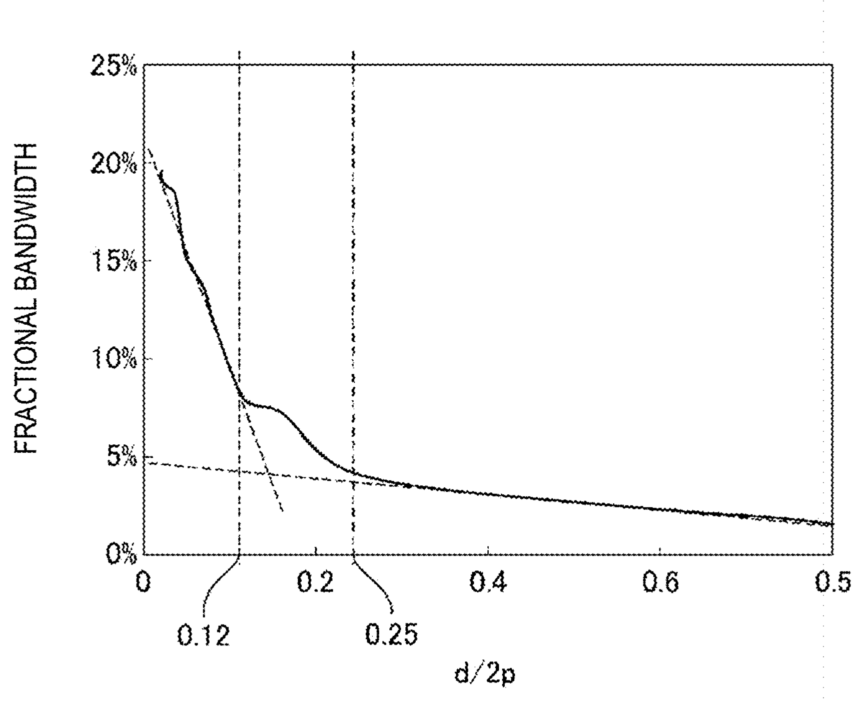
FIG. 6 is an explanatory diagram illustrating a relationship between d/2p and a fractional bandwidth of the acoustic wave device of the first preferred embodiment serving as a resonator, where p is a center-to-center distance or average center-to-center distance between adjacent electrodes and d is an average thickness of the piezoelectric layer.

A plurality of acoustic wave devices are produced by varying d/2p of the acoustic wave device having the resonance characteristics illustrated in FIG. 5. FIG. 6 is an explanatory diagram illustrating a relationship between d/2p and a fractional bandwidth of the acoustic wave device of the first preferred embodiment defining and functioning as a resonator, where p is the center-to-center distance between adjacent electrode fingers or the average center-to-center distance between adjacent electrode fingers, and d is the average thickness of the piezoelectric layer 2.

As illustrated in FIG. 6, if d/2p exceeds about 0.25 (or d/p>about 0.5), the fractional bandwidth falls below about 5% even when d/p is adjusted. On the other hand, if d/2p≤about 0.25 (or d/p≤about 0.5) is satisfied, the fractional bandwidth can be made greater than or equal to about 5% by varying d/p within the range, that is, a resonator having a high coupling coefficient can be obtained. If d/2p is less than or equal to about 0.12, that is, if d/p is less than or equal to about 0.24, the fractional bandwidth can be made as high as about 7% or more. Additionally, by adjusting d/p within this range, a resonator with a wider fractional bandwidth and a higher coupling coefficient can be produced. Thus, by making d/p less than or equal to about 0.5, a resonator with a higher coupling coefficient using first-order thickness shear mode bulk waves can be obtained.

It is simply required that there be at least one electrode pair. In the case of one electrode pair, p is the center-to-center distance between adjacent electrode fingers 3 and 4. In the case of greater than or equal to 1.5 electrode pairs, p may be the average center-to-center distance between adjacent electrode fingers 3 and 4.

If the piezoelectric layer 2 varies in thickness, the average thickness of the piezoelectric layer 2 may be used as the thickness d of the piezoelectric layer 2.

Figure 7:
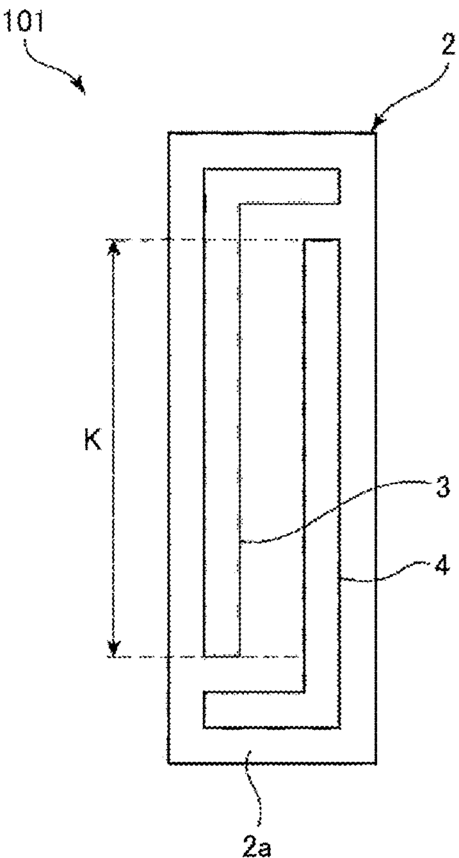
FIG. 7 is a plan view illustrating an example of one electrode pair in an acoustic wave device according to the first preferred embodiment of the present invention.

FIG. 7 is a plan view illustrating an example of one electrode pair in an acoustic wave device according to the first preferred embodiment. An acoustic wave device 101 includes one electrode pair consisting of the electrode fingers 3 and 4 on the first principal surface 2*a* of the piezoelectric layer 2. K in FIG. 7 indicates an overlap width. As described above, an acoustic wave device according to a preferred embodiment the present invention may include only one electrode pair. Even in this case, the first-order thickness shear mode bulk waves can be effectively excited if d/p is less than or equal to about 0.5.

The excitation region C is a region where any adjacent electrode fingers 3 and 4 of the plurality electrode fingers 3 and 4 overlap as viewed in the direction in which the adjacent electrode fingers 3 and 4 face each other. It is preferable in the acoustic wave device 1 that MR≤1.75(d/p)+0.075 is satisfied, where MR is a metallization ratio MR of the adjacent electrode fingers 3 and 4 to the excitation region C. Spurious emission can be effectively reduced in this case. This will be described with reference to FIG. 8 and FIG. 9.

Figure 8:
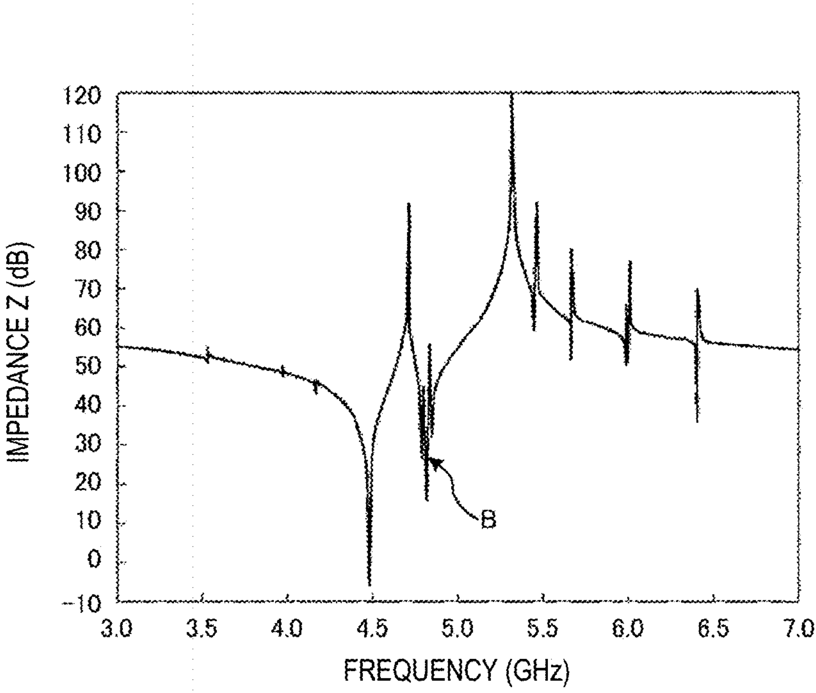
FIG. 8 is a reference diagram illustrating an example of resonance characteristics of the acoustic wave device according to the first preferred embodiment of the present invention.

FIG. 8 is a reference diagram illustrating an example of resonance characteristics of the acoustic wave device according to the first preferred embodiment. Arrow B indicates a spurious emission appearing between the resonant frequency and the anti-resonant frequency. In this example, d/p is about 0.08, $LiNbO_3$ has Euler angles (about 0°, about 0°, about 90°), and the metallization ratio MR is about 0.35.

The metallization ratio MR will now be described with reference to FIG. 1B. To focus on one pair of electrode fingers 3 and 4 of the electrode structure in FIG. 1B, the description assumes that only the one pair of electrode fingers 3 and 4 is provided. In this case, a region enclosed by a dash-dot line is the excitation region C. When the electrode fingers 3 and 4 are viewed in the direction orthogonal or substantially orthogonal to the length direction of the electrode fingers 3 and 4, or viewed in the direction in which the electrode fingers 3 and 4 face each other, the excitation region C includes a portion of the electrode finger 3 overlapping the electrode finger 4, a portion of the electrode finger 4 overlapping the electrode finger 3, and a portion between the electrode fingers 3 and 4 where the electrode fingers 3 and 4 face each other. The metallization ratio MR is the ratio of the area of the electrode fingers 3 and 4 in the excitation region C to the area of the excitation region C. That is, the metallization ratio MR is the ratio of the area of a metallized portion to the area of the excitation region C.

When a plurality of pairs of electrode fingers 3 and 4 are provided, MR may be the ratio of the area of metallized portions included in all excitation regions C to the sum of the areas of the excitation regions C.

Figure 9:
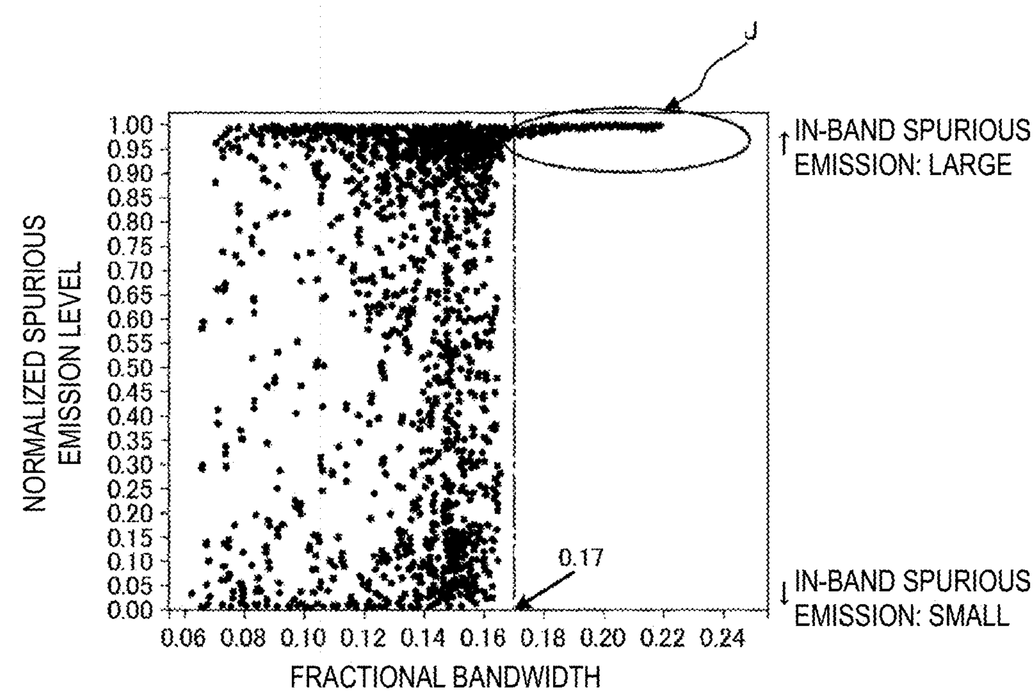
FIG. 9 is an explanatory diagram illustrating a relationship between the fractional bandwidth of the acoustic wave device of the first preferred embodiment of the present invention constituting each of many acoustic wave resonators, and the amount of phase rotation of impedance of spurious emission normalized at 180 degrees to represent the level of spurious emission.

FIG. 9 is an explanatory diagram illustrating a relationship between the fractional bandwidth of the acoustic wave device of the first preferred embodiment constituting each of many acoustic wave resonators, and the amount of phase rotation of impedance of spurious emission normalized at 180 degrees to represent the level of spurious emission. The fractional bandwidth is adjusted by varying the film thickness of the piezoelectric layer 2 or the dimensions of the electrode fingers 3 and 4. FIG. 9 illustrates a result of using a Z-cut $LiNbO_3$ layer as the piezoelectric layer 2. A similar tendency is observed when the piezoelectric layer 2 with other cut-angles is used.

In the region enclosed by oval J in FIG. 9, the level of spurious emission is as high as about 1.0. As shown in FIG. 9, when the fractional bandwidth exceeds about 0.17 or about 17%, a large spurious emission with a spurious emission level of 1 or higher appears in the pass band even if parameters defining the fractional bandwidth are changed. That is, as in the resonance characteristics illustrated in FIG. 8, a large spurious emission indicated by arrow B appears in the band. Therefore, it is preferable that the fractional bandwidth is, for example, less than or equal to about 17%.

In this case, adjusting the film thickness of the piezoelectric layer 2 or the dimensions of the electrode fingers 3 and 4 can reduce spurious emission.

Figure 10:
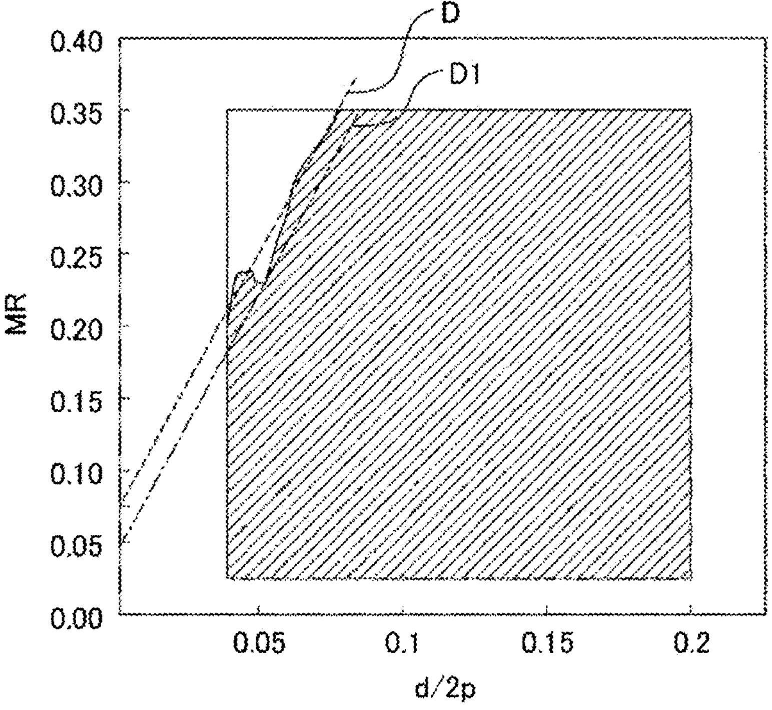
FIG. 10 is an explanatory diagram illustrating a relationship between d/2p, metallization ratio MR, and fractional bandwidth.

FIG. 10 is an explanatory diagram illustrating a relation between d/2p, metallization ratio MR, and fractional bandwidth. Various acoustic wave devices 1 of the first preferred embodiment are made by varying d/2p and MR to measure the fractional bandwidths. In FIG. 10, a hatched region to the right of broken line D is a region where the fractional bandwidth is less than or equal to about 17%. The boundary between the hatched and non-hatched regions is represented by MR=3.5(d/2p)+0.075 or MR=1.75(d/p)+0.075, and preferably MR≤1.75(d/p)+0.075. In this case, it is easier to make the fractional bandwidth less than or equal to about 17%. A more preferable region is one that is to the right of the boundary represented by MR=3.5(d/2p)+0.05, indicated by dash-dot line D1 in FIG. 10. That is, if MR≤about 1.75(d/p)+0.05 is satisfied, the fractional bandwidth can be reliably made less than or equal to about 17%.

Figure 11:
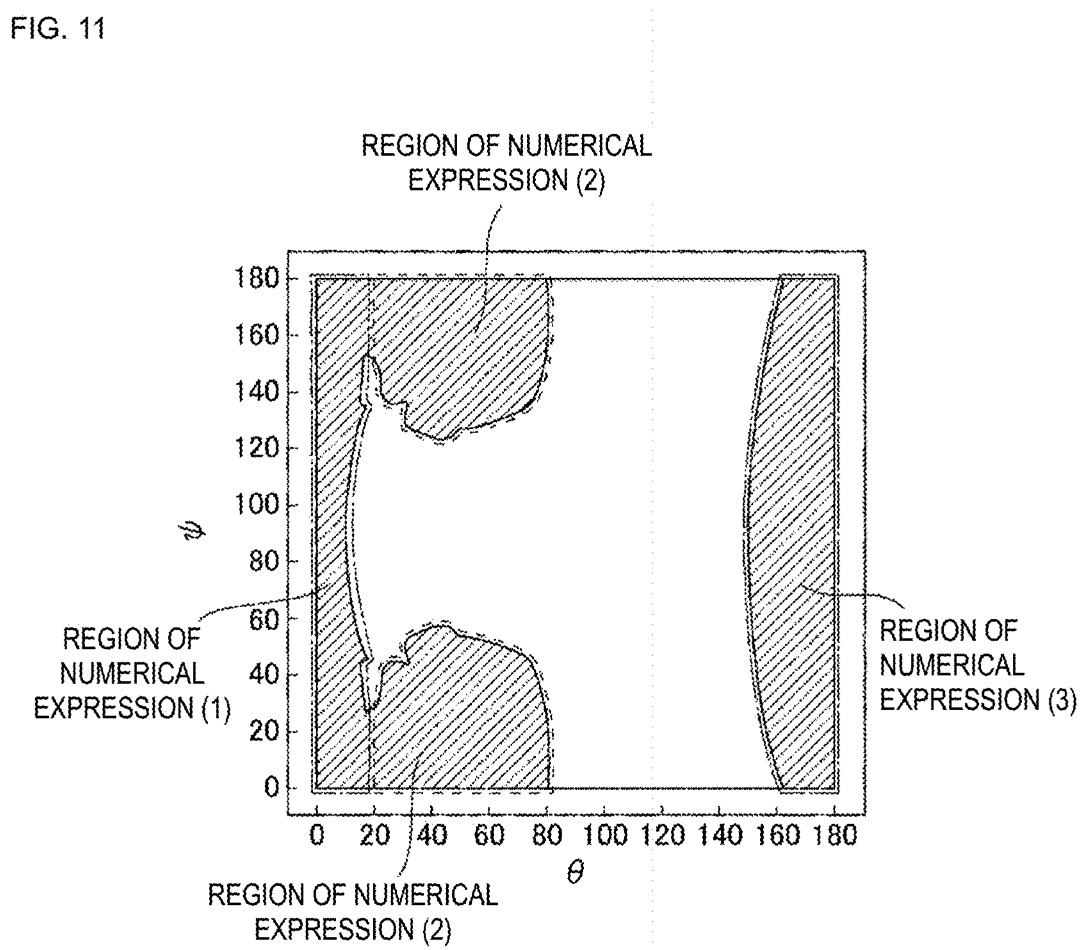
FIG. 11 is an explanatory diagram illustrating a map of fractional bandwidth with respect to Euler angles (0°, θ, ψ) of $LiNbO_3$ obtained when d/p is brought as close as possible to 0.

FIG. 11 is an explanatory diagram illustrating a map of fractional bandwidth with respect to Euler angles (0°, θ, ψ) of $LiNbO_3$ obtained when d/p is brought as close as possible to 0. Hatched regions in FIG. 11 are regions where a fractional bandwidth of at least greater than or equal to about 5% can be obtained. By approximating the ranges of these regions, ranges defined by numerical expression (1), numerical expression (2) and numerical expression (3) described below are obtained.

$$(0°\pm10°, 0° \text{ to } 20°, \text{any } \psi) \quad (1)$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad (2)$$

$$(0°\pm10°, [180°-30°(1-(\psi-90)^2/8100)^{1/2}] \text{ to } 180°, \text{any } \psi) \quad (3)$$

The ranges of the Euler angles defined by numerical expression (1), numerical expression (2), or numerical expression (3) are preferable, because a sufficiently wide fractional bandwidth can be achieved.

Figure 12:
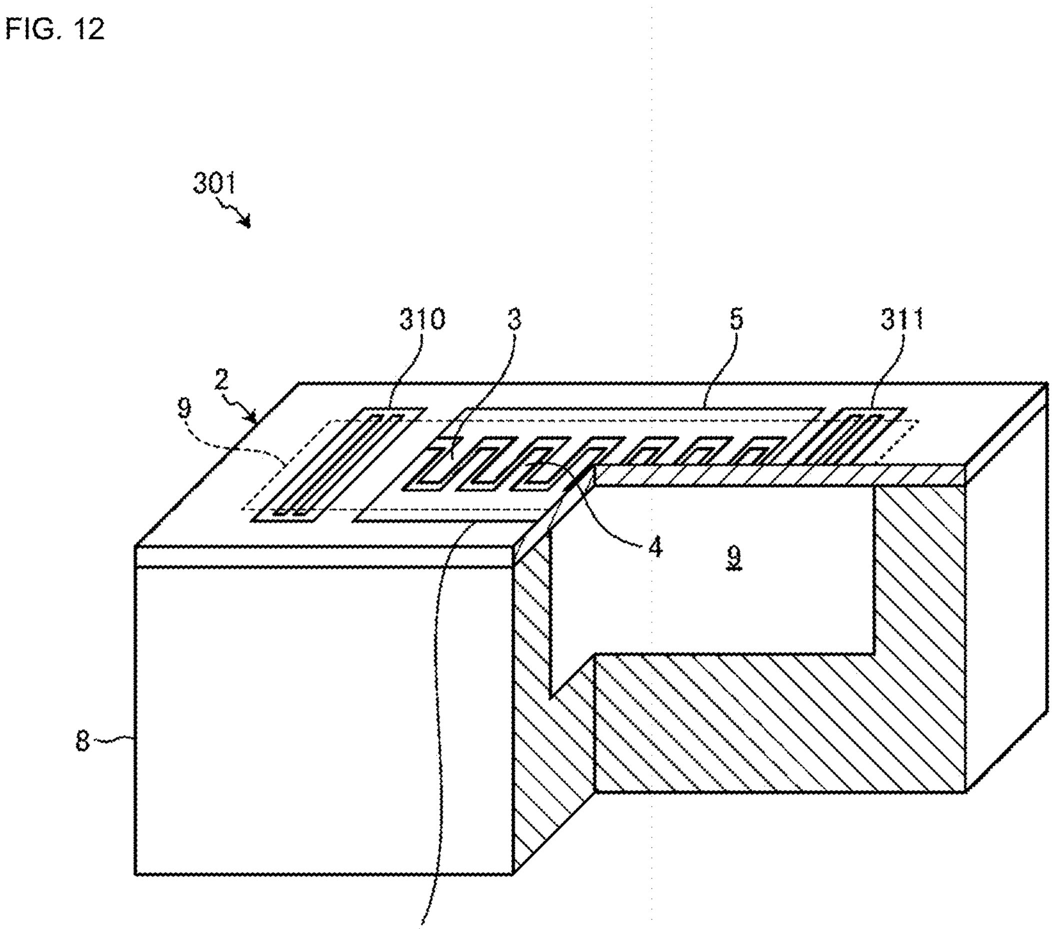
FIG. 12 is a partial cutaway perspective view for explaining an acoustic wave device according to a preferred embodiment of the present invention.

FIG. 12 is a partial cutaway perspective view for explaining an acoustic wave device according to a preferred embodiment of the present invention. In FIG. 12, the outer edge of the hollow 9 is indicated by a broken line. The acoustic wave device according to a preferred embodiment of the present invention may use plate waves. In this case, an acoustic wave device 301 includes reflectors 310 and 311, as illustrated in FIG. 12. The reflectors 310 and 311 are disposed on both sides of the electrode fingers 3 and 4 on the piezoelectric layer 2 in the propagation direction of acoustic waves. In the acoustic wave device 301, Lamb waves (or plate waves) are excited by applying an alternating-current electric field to the electrode fingers 3 and 4 above the hollow 9. With the reflectors 310 and 311 on both sides, the resonance characteristics based on Lamb waves (or plate waves) can be obtained.

As described above, the acoustic wave devices 1 and 101 use first-order thickness shear mode bulk waves. In the acoustic wave devices 1 and 101, the first and second electrode fingers 3 and 4 are adjacent electrodes and d/p is less than or equal to about 0.5, where d is the thickness of the piezoelectric layer 2 and p is the center-to-center distance between the first and second electrode fingers 3 and 4. This can improve the Q factor even when the acoustic wave device is reduced in size.

In the acoustic wave devices 1 and 101, the piezoelectric layer 2 is made of, for example, lithium niobate or lithium tantalate. The first principal surface 2*a* or the second principal surface 2*b* of the piezoelectric layer 2 includes thereon the first and second electrode fingers 3 and 4 facing each other in the direction crossing the thickness direction of the piezoelectric layer 2. The first and second electrode fingers 3 and 4 are preferably covered with a protective film.

Figure 13A:
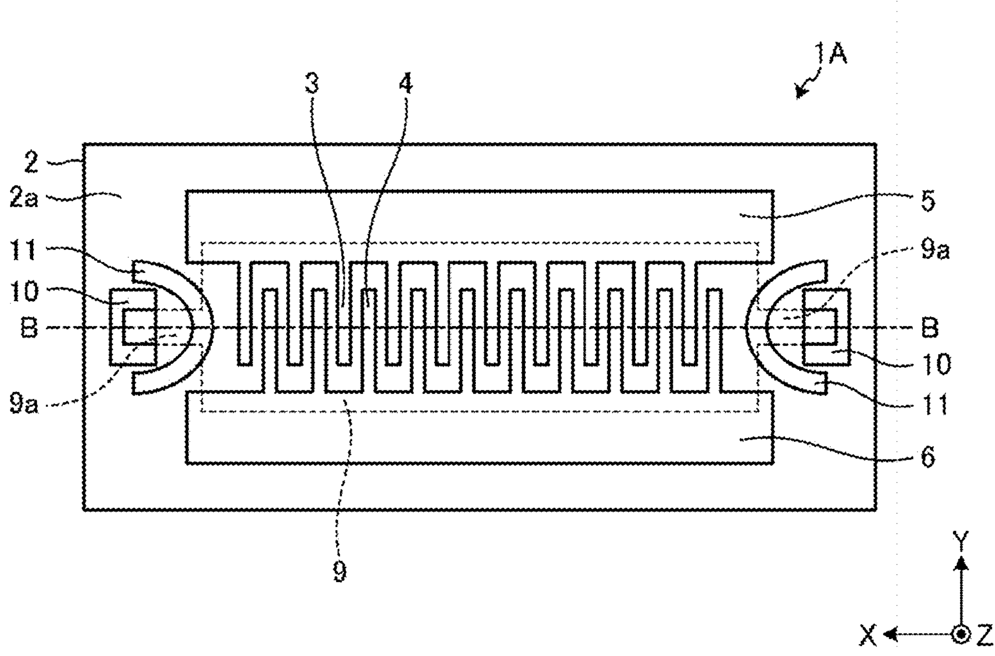
FIG. 13A is a plan view illustrating Example 1 of the acoustic wave device according to the first preferred embodiment of the present invention.
Figure 13B:
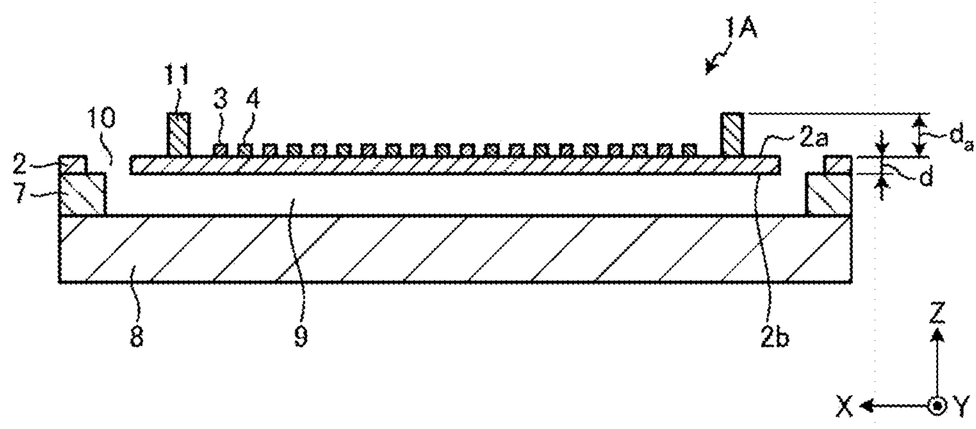
FIG. 13B is a cross-sectional view taken along line B-B of FIG. 13A.

FIG. 13A is a plan view illustrating Example 1 of the acoustic wave device according to the first preferred embodiment. FIG. 13B is a cross-sectional view taken along line B-B of FIG. 13A. As illustrated in FIG. 13A, an acoustic wave device 1A includes a through hole 10 communicating with the hollow 9, and a reinforcing film 11 configured to reinforce the piezoelectric layer 2. In Examples described below, the support substrate 8 is a plate member without the cavity 8*a*. In the acoustic wave device 1A according to Example 1, the hollow 9 is a space surrounded by the second principal surface 2*b* of the piezoelectric layer 2, the inner wall of the cavity 7*a* in the dielectric film 7, and a surface of the support substrate 8 adjacent to the piezoelectric layer 2. The hollow 9 in the acoustic wave device 1A includes a region overlapping the interdigital transducer electrode, and an extended passage 9*a* which is a hollow region communicating with the through hole 10.

The through hole 10 is a hole penetrating the piezoelectric layer 2. The through hole 10 is provided at a position at least partially overlapping the hollow 9 and not overlapping the interdigital transducer electrode in plan view in the Z direction. In Example 1, as illustrated in FIG. 13A, two through holes 10 are provided on center line B-B of the interdigital transducer electrode in the Y direction, on both sides of the interdigital transducer electrode in the X direction. Also, as illustrated in FIG. 13B, the through holes 10 communicate with the respective extended passages 9*a* of the hollow 9 in the Z direction, described below. Accordingly, in Example 1, as illustrated in FIG. 13B, the through holes 10 communicate with each other through the hollow 9. Although it is preferable that the piezoelectric layer 2 is provided with at least two through holes 10, the piezoelectric layer 2 may be provided with one through hole 10. Although the through holes 10 are rectangular or substantially rectangular in plan view in the Z direction in Example 1, the shape of the through holes 10 is not limited to this. For example, the through holes 10 may have a circular, substantially circular, or other polygonal shapes.

The extended passages 9*a* are regions of the hollow 9 communicating with the respective through holes 10. In plan view in the Z direction, the extended passages 9*a* are disposed at both ends of the hollow 9 in the X direction, at positions overlapping the respective through holes 10. That is, the extended passages 9*a* are disposed at points communicating with the respective through holes 10. In Example 1, each extended passage 9*a* is disposed in a region not overlapping the first and second electrode fingers 3 and 4 in plan view in the Z direction. The extended passage 9*a* is preferably smaller in area than a region of the hollow 9 overlapping the interdigital transducer electrode. The maximum size of the extended passage 9*a* in the Y direction is preferably smaller than the maximum size of the region of the hollow 9 overlapping the interdigital transducer electrode in the Y direction. Although the extended passage 9*a* is rectangular or substantially rectangular in plan view in the Z direction in Example 1, the shape of the extended passage 9*a* is not limited to this.

The reinforcing films 11 each are a film configured to reinforce the piezoelectric layer 2. As illustrated in FIG. 13A, the reinforcing film 11 is disposed on the first principal surface 2*a* of the piezoelectric layer 2, at a position not overlapping the first and second electrode fingers 3 and 4 in plan view in the Z direction. The reinforcing film 11 at least partially overlaps the hollow 9 in plan view in the Z direction. In Example 1, the reinforcing film 11 is at least partially disposed between the interdigital transducer electrode and the through hole 10 in the X direction. In Example 1, the reinforcing film 11 has a curved shape bulging towards the interdigital transducer electrode. In this case, the reinforcing film 11 preferably extends across the inner wall of the extended passage 9*a* in the Y direction. This can reduce or prevent the occurrence of cracks in the piezoelectric layer 2 originating from the through hole 10.

A thickness da of the reinforcing film 11 is preferably greater than or equal to half the thickness d of the piezoelectric layer 2 in a region overlapping the hollow 9 in plan view in the first direction. In Example 1, the material of the reinforcing film 11 is a metal, such as, for example, titanium, aluminum, copper, or nickel. This can improve heat dispersion performance. Also, in Example 1, the reinforcing film 11 has a curved shape bulging towards the interdigital transducer electrode. The reinforcing film 11 can thus reduce or prevent unwanted reflective waves from being reflected to the interdigital transducer electrode and can reduce or prevent spurious emission.

Although the acoustic wave device according to the first preferred embodiment has been described, the present preferred embodiment is not limited to the acoustic wave device 1A presented as Example 1. Other Examples will now be described using drawings.

Figure 14:
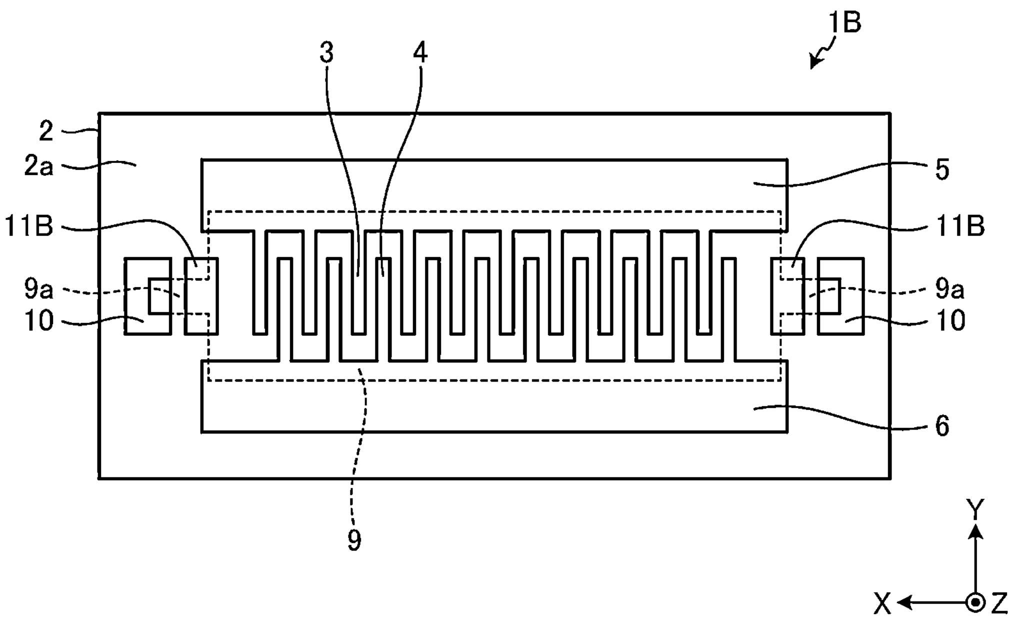
FIG. 14 is a plan view illustrating Example 2 of the acoustic wave device according to the first preferred embodiment of the present invention.
Figure 15:
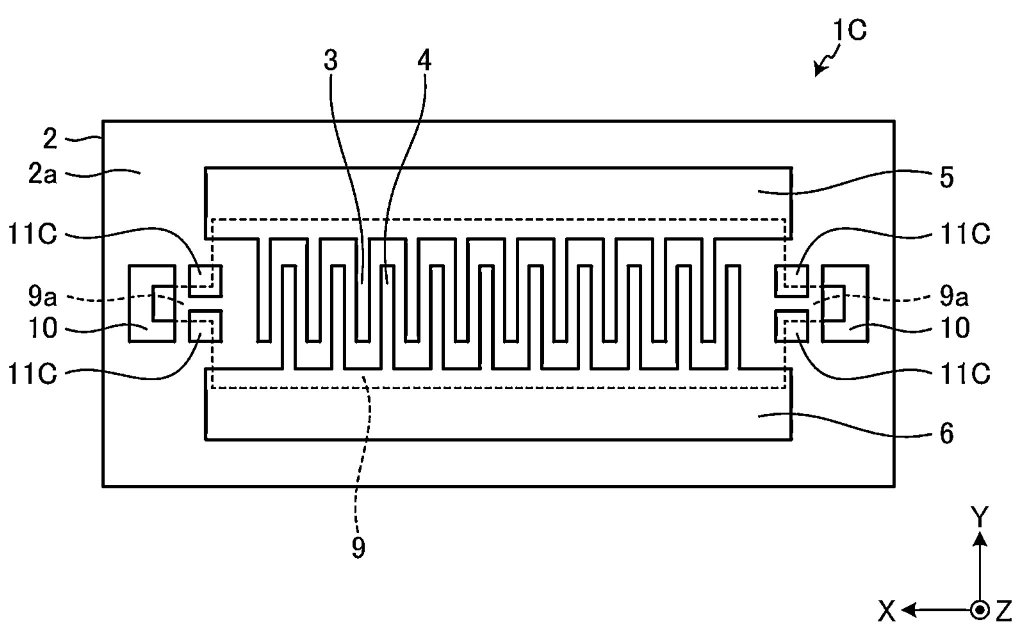
FIG. 15 is a plan view illustrating Example 3 of the acoustic wave device according to the first preferred embodiment of the present invention.

FIG. 14 is a plan view illustrating Example 2 of the acoustic wave device according to the first preferred embodiment. FIG. 15 is a plan view illustrating Example 3 of the acoustic wave device according to the first preferred embodiment. As illustrated in FIG. 14 and FIG. 15, reinforcing films 11B and 11C may be rectangular or substantially rectangular in shape. In this case, the reinforcing film 11 preferably overlaps at least a portion of a boundary between a portion of the hollow 9 overlapping the interdigital transducer electrode and the extended passage 9*a*. Although each extended passage 9*a* is provided with one reinforcing film 11B in FIG. 14, the configuration is not limited to this. For example, each extended passage 9*a* may be provided with two reinforcing films 11C as illustrated in FIG. 15. With this configuration, the reinforcing films 11B and 11C can prevent the occurrence of cracks in the piezoelectric layer 2 originating from the boundary between the portion of the hollow 9 overlapping the interdigital transducer electrode and the extended passage 9*a*.

Figure 16:
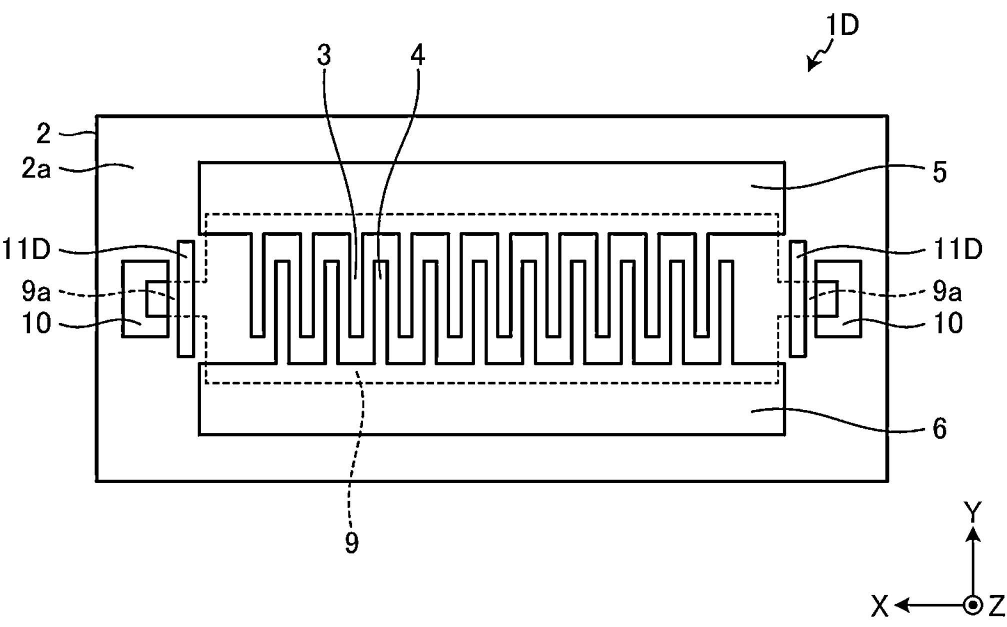
FIG. 16 is a plan view illustrating Example 4 of the acoustic wave device according to the first preferred embodiment of the present invention.

FIG. 16 is a plan view illustrating Example 4 of the acoustic wave device according to the first preferred embodiment. The position of the reinforcing film 11 having a rectangular or substantially rectangular shape is not limited to those described in Example 2 and Example 3. For example, as illustrated in FIG. 16, in plan view in the Z direction, a reinforcing film 11D may extend across the inner wall of the extended passage 9*a* in the Y direction. The reinforcing film 11D can thus prevent deformation of a region of the piezoelectric layer 2 susceptible to deformation due to the absence of the electrode fingers 3 and 4 in the region. This can reduce or prevent the occurrence of cracks in the piezoelectric layer 2.

Figure 17:
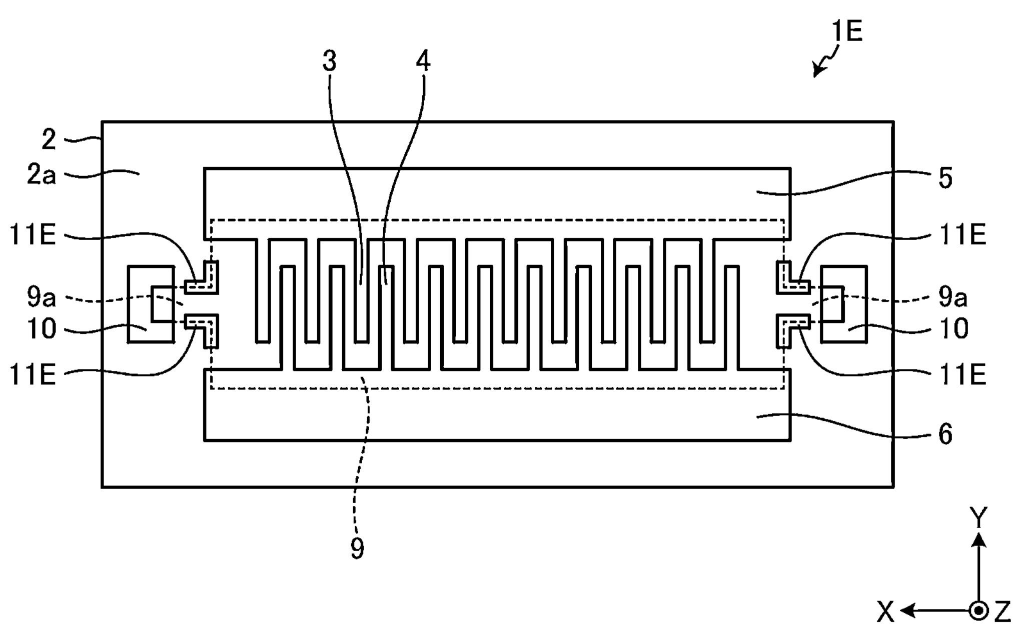
FIG. 17 is a plan view illustrating Example 5 of the acoustic wave device according to the first preferred embodiment of the present invention.

FIG. 17 is a plan view illustrating Example 5 of the acoustic wave device according to the first preferred embodiment. As illustrated in FIG. 17, a reinforcing film 11E may have a linear shape. In this case, as illustrated in FIG. 17, the reinforcing film 11E preferably overlaps a portion of the boundary between a portion of the hollow 9 overlapping the interdigital transducer electrode and the extended passage 9*a*, and extends along the outer wall of the hollow 9 in plan view in the Z direction. With this configuration, the reinforcing film 11E can reduce or prevent the occurrence of cracks in the piezoelectric layer 2 originating from the boundary.

Figure 18:
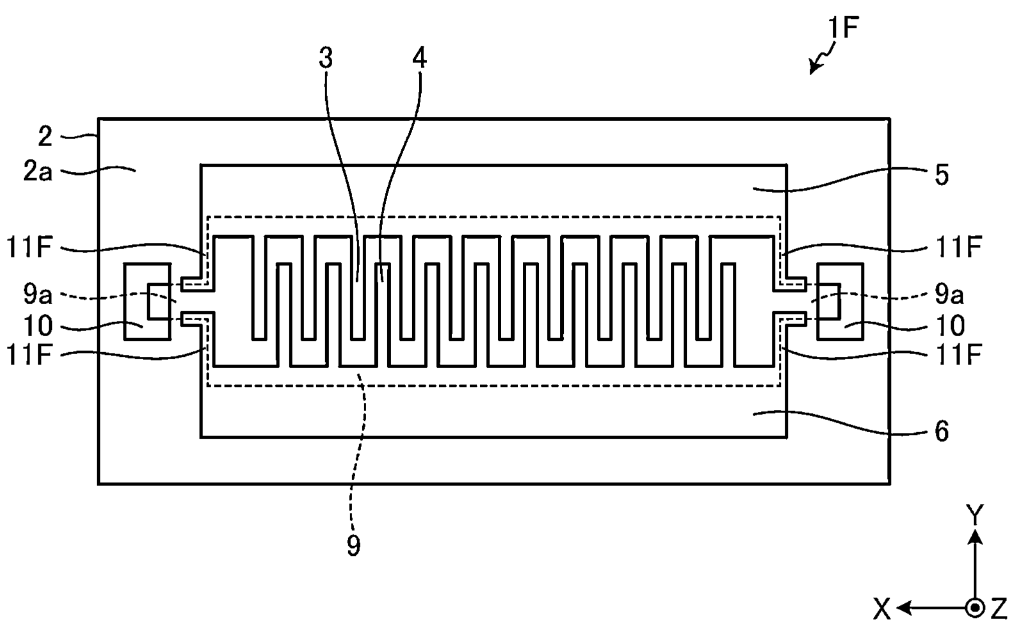
FIG. 18 is a plan view illustrating Example 6 of the acoustic wave device according to the first preferred embodiment of the present invention.

FIG. 18 is a plan view illustrating Example 6 of the acoustic wave device according to the first preferred embodiment. As illustrated in FIG. 18, a reinforcing film 11F may be connected to, and integral with, the first busbar 5 or the second busbar 6. In this case, the reinforcing film 11F is connected to one of the first busbar 5 and the second busbar 6 so as to prevent the first busbar 5 and the second busbar 6 from being short-circuited. That is, the reinforcing film 11F connected to the first busbar 5 is preferably not electrically connected to the second busbar 6, and the reinforcing film 11F connected to the second busbar 6 is preferably not electrically connected to the first busbar 5. This structure enables simultaneous production of the reinforcing film 11F and the busbars 5 and 6 and facilitates production of the reinforcing film 11F.

Figure 19:
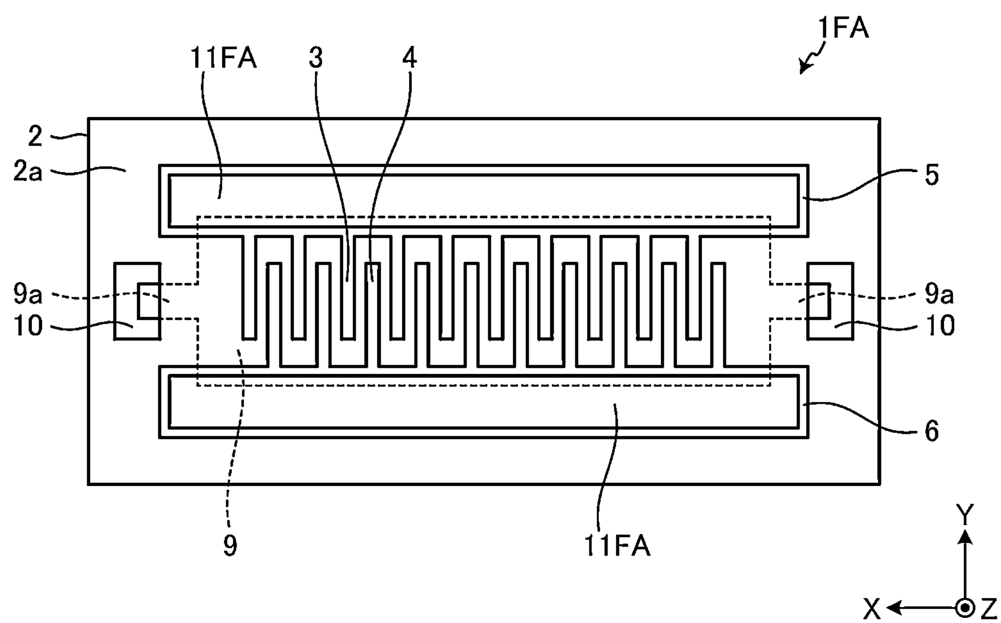
FIG. 19 is a plan view illustrating Example 7 of the acoustic wave device according to the first preferred embodiment of the present invention.

FIG. 19 is a plan view illustrating Example 7 of the acoustic wave device according to the first preferred embodiment. As illustrated in FIG. 19, a reinforcing film 11FA may be disposed on, and integral with, the first busbar 5 or the second busbar 6. That is, the reinforcing film 11FA may be integral with the first busbar 5 or the second busbar 6 and provide a film thicker than the interdigital transducer electrode. In this case, the reinforcing film 11FA preferably overlaps a portion of the inner wall of the hollow 9 extending in the X direction, in the region of the hollow 9 overlapping the interdigital transducer in plan view in the Z direction. In FIG. 19, the reinforcing film 11FA overlaps the entire or substantially the entire inner wall of the hollow 9 extending in the X direction, in the region of the hollow 9 overlapping the interdigital transducer in plan view in the Z direction. This structure enables simultaneous production of the reinforcing film 11FA and the busbars 5 and 6 and facilitates production of the reinforcing film 11FA. When the reinforcing film 11FA is made of metal, the electrical resistance of the busbar 5 or 6 can be reduced.

Figure 20:
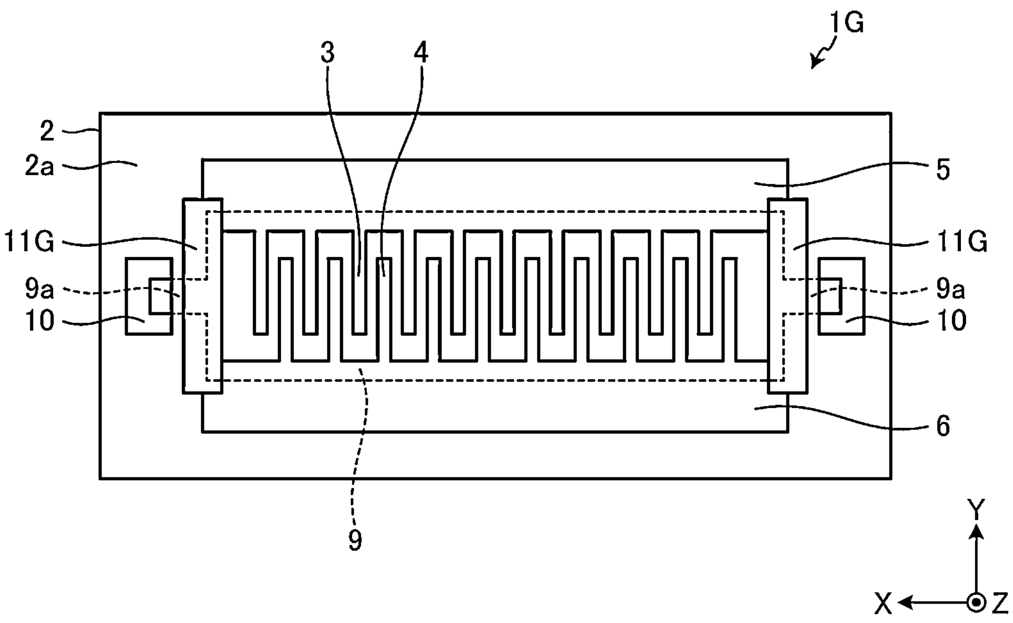
FIG. 20 is a plan view illustrating Example 8 of the acoustic wave device according to the first preferred embodiment of the present invention.

FIG. 20 is a plan view illustrating Example 8 of the acoustic wave device according to the first preferred embodiment. The material of the reinforcing film 11 is not limited to a metal. For example, the reinforcing film 11 may be made of a dielectric, such as silicon oxide, silicon nitride, aluminum nitride, alumina, or tantalum oxide. In this case, a reinforcing film 11G may be connected to both of the first busbar 5 and the second busbar 6, as illustrated in FIG. 20. The reinforcing film 11G is an insulator in this case, and is insulated from the first busbar 5 and the second busbar 6. The reinforcing film 11G can thus reinforce the piezoelectric layer 2 while preventing the first busbar 5 and the second busbar 6 from being electrically connected through the reinforcing film 11G.

Figure 21:
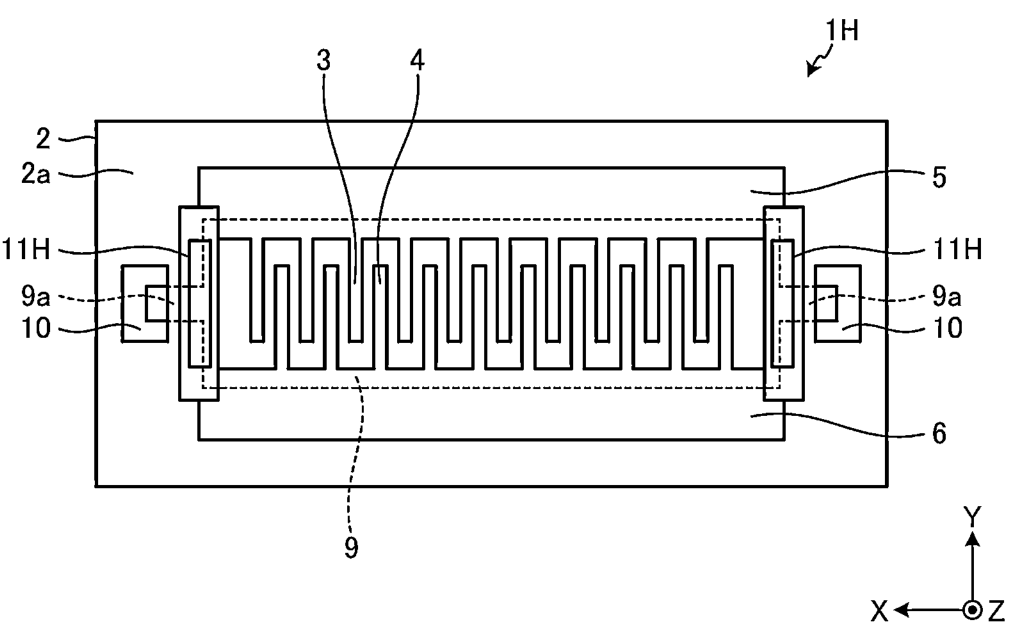
FIG. 21 is a plan view illustrating Example 9 of the acoustic wave device according to the first preferred embodiment of the present invention.

FIG. 21 is a plan view illustrating Example 9 of the acoustic wave device according to the first preferred embodiment. The reinforcing film 11 may include any metal and dielectric described above. In this case, a reinforcing film 11H may be connected to both the first busbar 5 and the second busbar 6, as illustrated in FIG. 21, as long as connections to the first busbar 5 and the second busbar 6 are insulators. In Example 9, the reinforcing film 11H is structured to surround the metal with the dielectric. With this configuration, where the reinforcing film 11H is insulated from the first busbar 5 and the second busbar 6, the reinforcing film 11H can still reinforce the piezoelectric layer 2 while preventing the first busbar 5 and the second busbar 6 from being electrically connected through the reinforcing film 11H.

Figure 22:
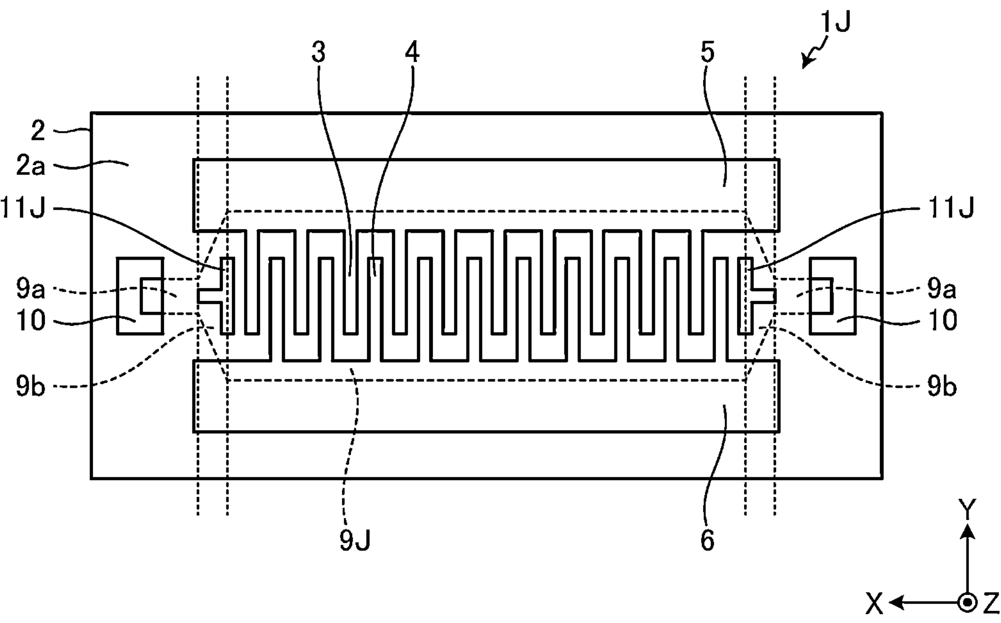
FIG. 22 is a plan view illustrating Example 10 of the acoustic wave device according to the first preferred embodiment of the present invention.

FIG. 22 is a plan view illustrating Example 10 of the acoustic wave device according to the first preferred embodiment. As illustrated in FIG. 22, the hollow 9J may further include a tapered region 9*b* to connect a region overlapping the interdigital transducer electrode to the extended passage 9*a*. The tapered region 9*b* is a hollow region whose width in the Y direction decreases towards the extended passage 9*a*. In plan view in the Z direction, the tapered region 9*b* is disposed between the region overlapping the interdigital transducer electrode and the extended passage 9*a*. The tapered region 9*b* communicates with the region overlapping the interdigital transducer electrode and the extended passage 9*a*. In this case, a reinforcing film 11J preferably overlaps the tapered region 9*b*, as illustrated in FIG. 22. The reinforcing film 11J can thus reduce or prevent the occurrence of cracks in the piezoelectric layer 2 originating from the tapered region 9*b*.

Figure 23:
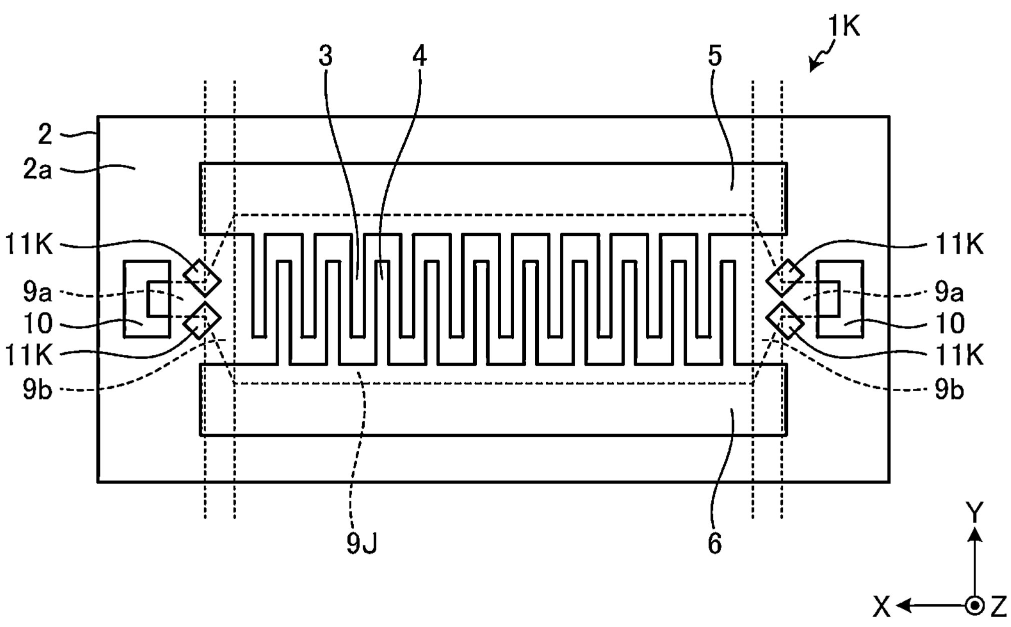
FIG. 23 is a plan view illustrating Example 11 of the acoustic wave device according to the first preferred embodiment of the present invention.

FIG. 23 is a plan view illustrating Example 11 of the acoustic wave device according to the first preferred embodiment. When the hollow 9J further includes the tapered region 9*b*, a reinforcing film 11K may partially overlap the hollow 9J. In this case, the reinforcing film 11K preferably overlaps the boundary between the tapered region 9*b* and the extended passage 9*a*, as illustrated in FIG. 23. The reinforcing film 11K can thus reduce or prevent the occurrence of cracks in the piezoelectric layer 2 originating from the tapered region 9*b*.

Figure 24:
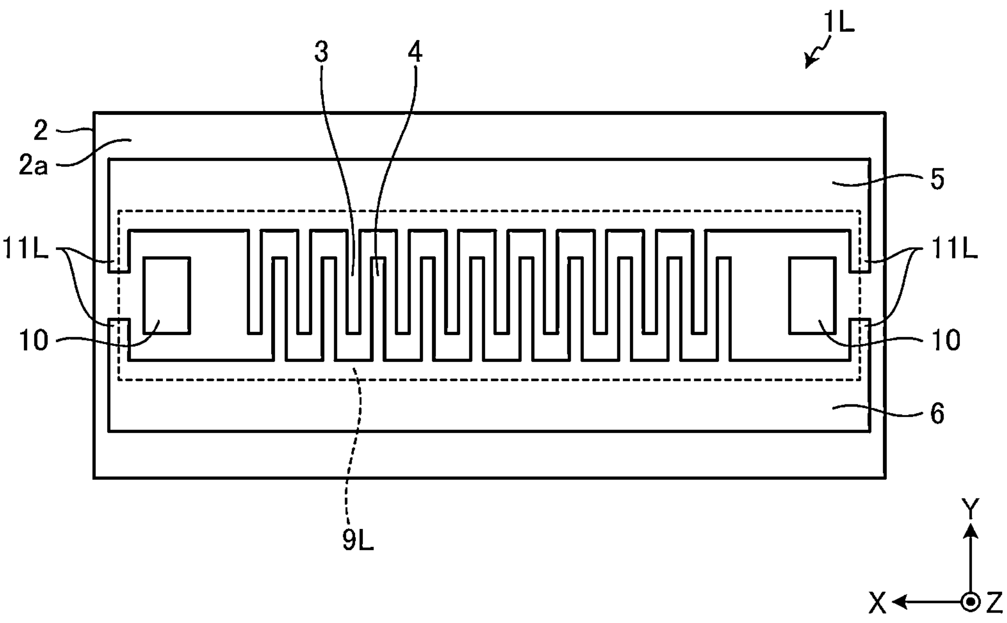
FIG. 24 is a plan view illustrating Example 12 of the acoustic wave device according to the first preferred embodiment of the present invention.
Figure 25:
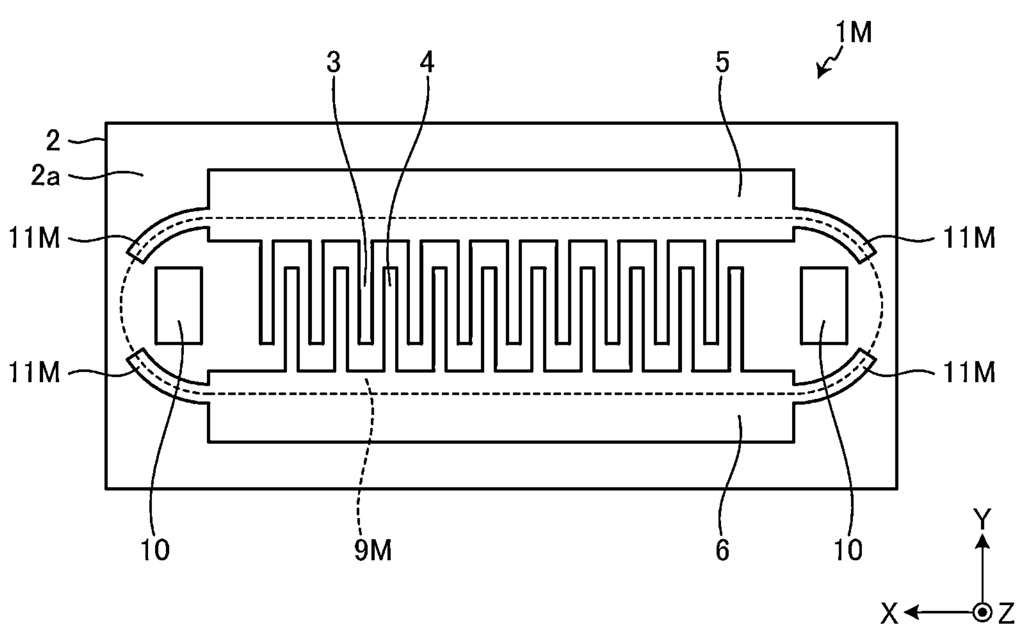
FIG. 25 is a plan view illustrating Example 13 of the acoustic wave device according to the first preferred embodiment of the present invention.

FIG. 24 is a plan view illustrating Example 12 of the acoustic wave device according to the first preferred embodiment. FIG. 25 is a plan view illustrating Example 13 of the acoustic wave device according to the first preferred embodiment. As illustrated in FIG. 24 and FIG. 25, the extended passage 9*a* is optional for the acoustic wave device according to the first preferred embodiment.

When the hollow 9 does not include the extended passage 9*a*, the reinforcing film 11 preferably overlaps the outer wall of the hollow 9. For example, as illustrated in FIG. 24, a reinforcing film 11L may be connected to, and integral with, one of the first busbar 5 and the second busbar 6.

The reinforcing film 11L is connected to the busbar 5 or 6 in the Y direction in Example 12, but the configuration is not limited to this. The reinforcing film 11L may be connected to the busbar 5 or 6 at any position depending on the shape of the outer wall of the hollow 9. For example, as illustrated in FIG. 25, a reinforcing film 11M may be connected to the busbar 5 or 6 in the X direction.

Figure 26:
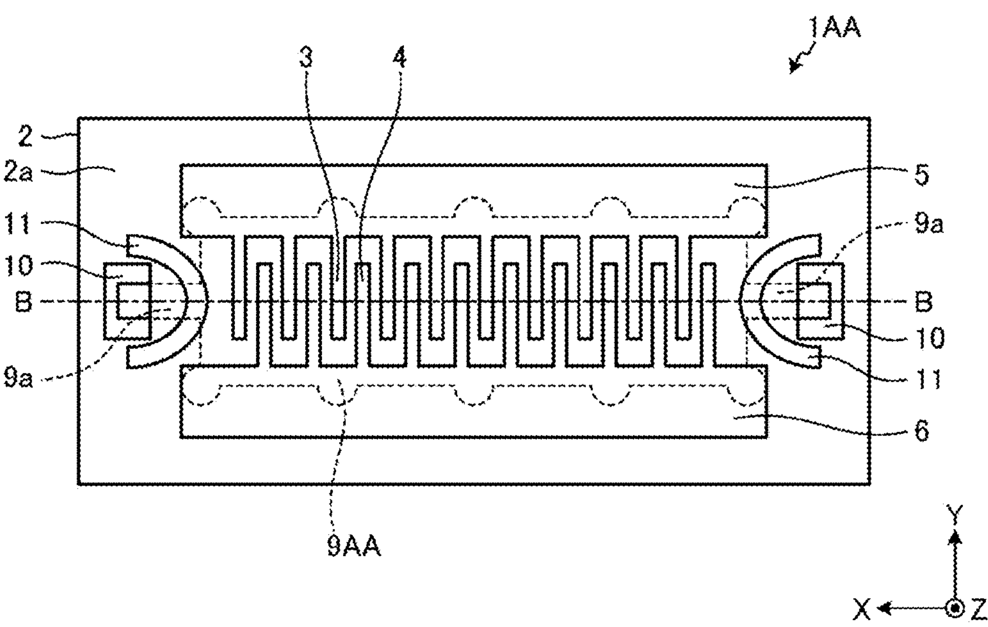
FIG. 26 is a plan view illustrating Example 14 of the acoustic wave device according to the first preferred embodiment of the present invention.

FIG. 26 is a plan view illustrating Example 14 of the acoustic wave device according to the first preferred embodiment. As illustrated in FIG. 26, in a portion of the hollow 9AA overlapping the interdigital transducer electrode in plan view in the Z direction, the inner walls of the end portions of the hollow 9AA in the Y direction do not need to be linear in shape. For example, as illustrated in FIG. 26, the inner walls of the end portions of a hollow 9AA in the Y direction may be produced by forming a plurality of rounded grooves in the inner walls linearly extending in the X direction. This can reduce or prevent deformation of the hollow 9AA and warpage of the piezoelectric layer 2.

Figure 27:
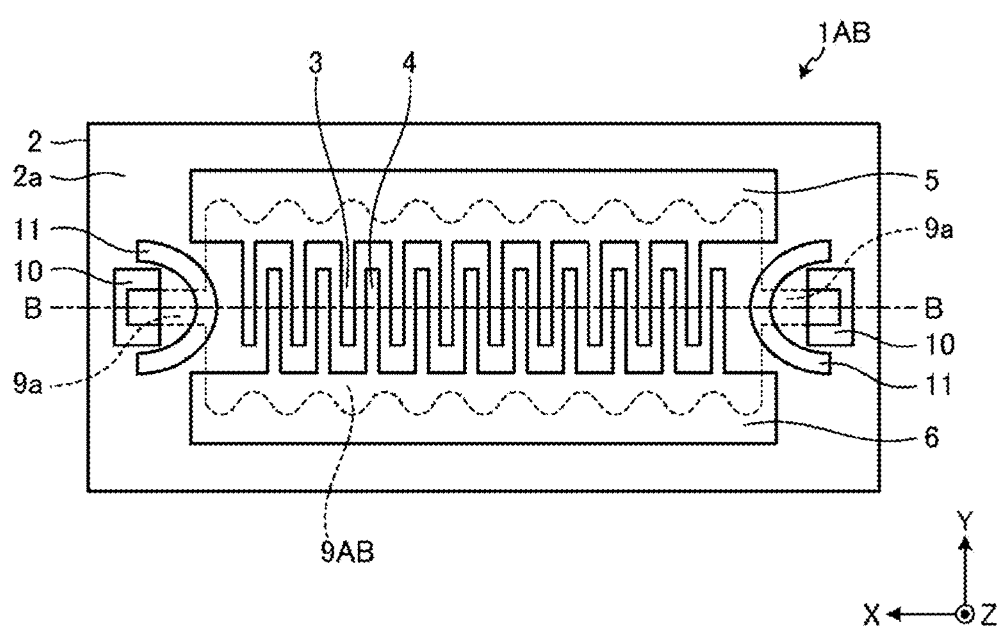
FIG. 27 is a plan view illustrating Example 15 of the acoustic wave device according to the first preferred embodiment of the present invention.

FIG. 27 is a plan view illustrating Example 15 of the acoustic wave device according to the first preferred embodiment. As illustrated in FIG. 27, the inner walls of the end portions of a hollow 9AB in the Y direction may have a corrugated shape with continuous ridges and grooves. In Example 15, the inner walls of two end portions of the hollow 9AB in the Y direction are in the shape of sine waves symmetric with respect to line B-B. The shape is not limited to this, and other wave shapes or their combination may be used. Examples of using other wave shapes will now be described with reference to drawings.

Figure 28:
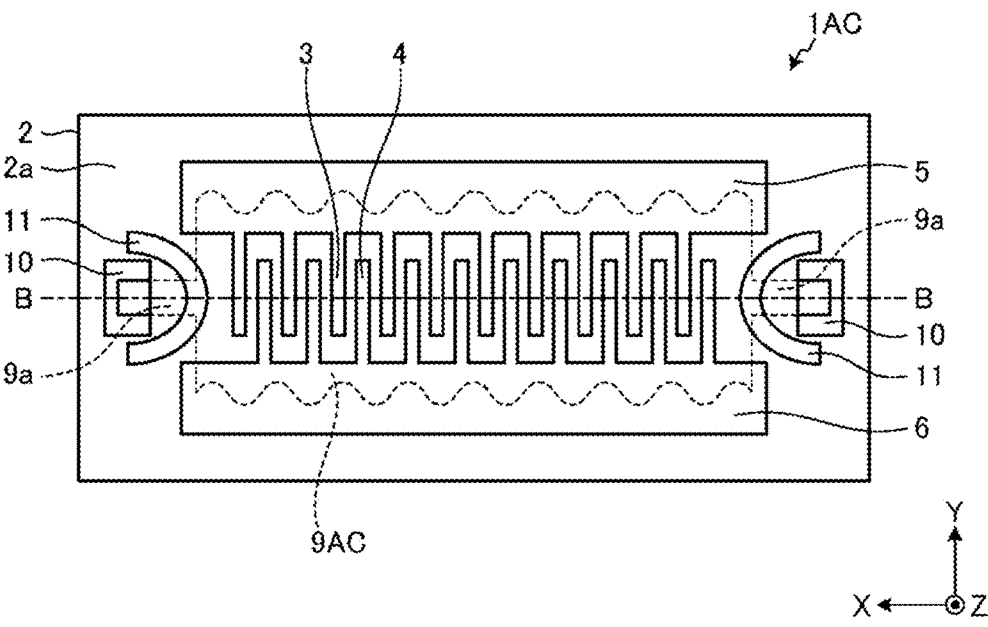
FIG. 28 is a plan view illustrating Example 16 of the acoustic wave device according to the first preferred embodiment of the present invention.
Figure 29:
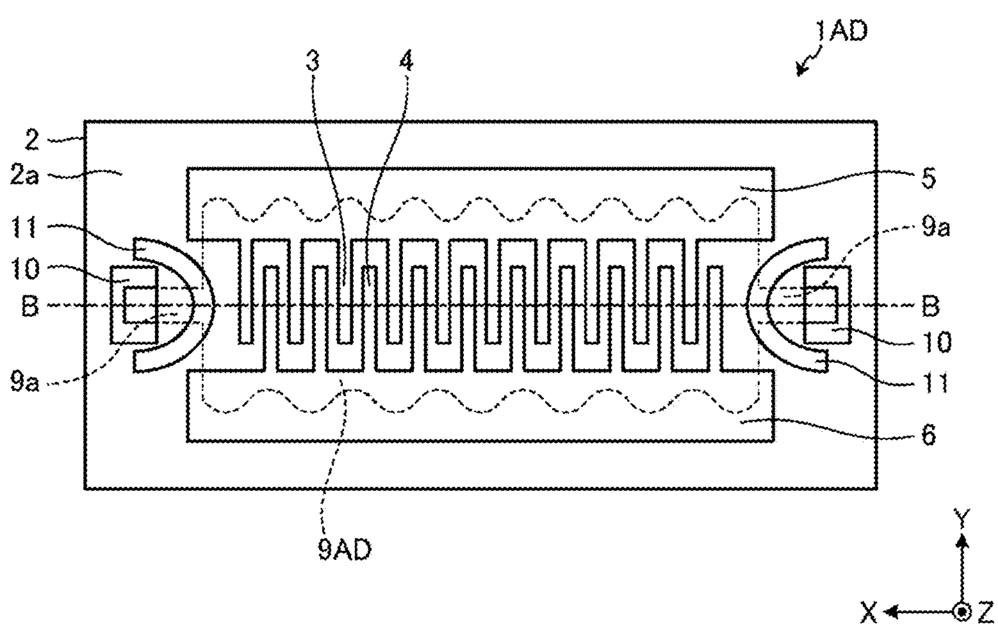
FIG. 29 is a plan view illustrating Example 17 of the acoustic wave device according to the first preferred embodiment of the present invention.
Figure 30:
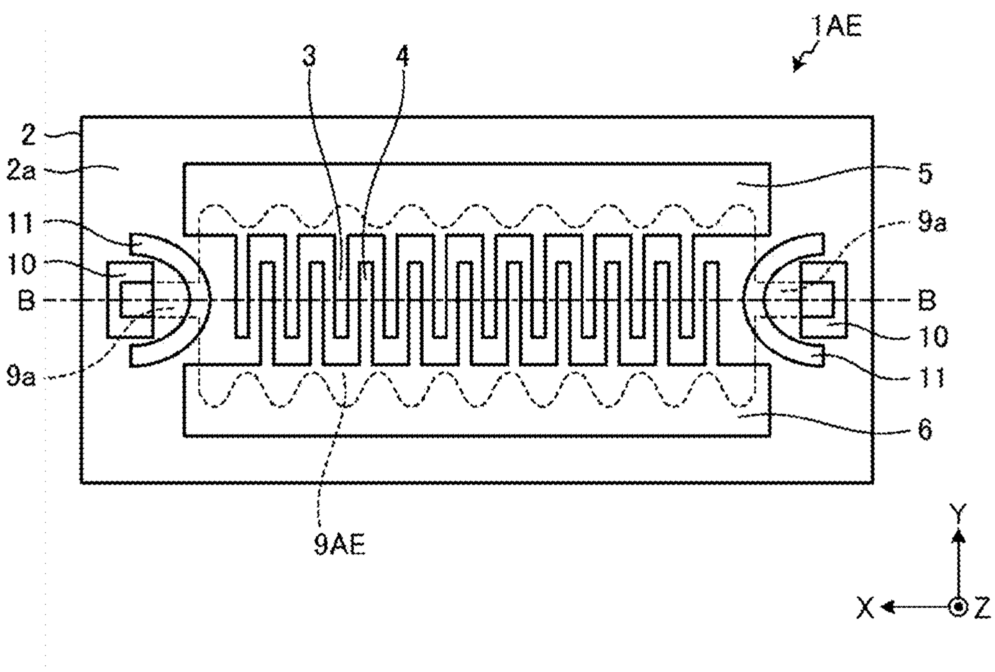
FIG. 30 is a plan view illustrating Example 18 of the acoustic wave device according to the first preferred embodiment of the present invention.

FIG. 28 is a plan view illustrating Example 16 of the acoustic wave device according to the first preferred embodiment. FIG. 29 is a plan view illustrating Example 17 of the acoustic wave device according to the first preferred embodiment. FIG. 30 is a plan view illustrating Example 18 of the acoustic wave device according to the first preferred embodiment. In Example 15, the inner walls of two end portions of the hollow 9AB in the Y direction are in the shape of sine waves symmetric or substantially symmetric with respect to line B-B. However, the shape is not limited to this. For example, as illustrated in FIG. 28, the inner walls of two end portions of a hollow 9AC in the Y direction may be in the shape of sine waves with different phases. As illustrated in FIG. 29, the inner walls of two end portions of a hollow 9AD in the Y direction may be in the shape of sine waves with different wave lengths. As illustrated in FIG. 30, the inner walls of two end portions of the hollow 9AE in the Y direction may be in the shape of sine waves with different amplitudes.

Figure 31:
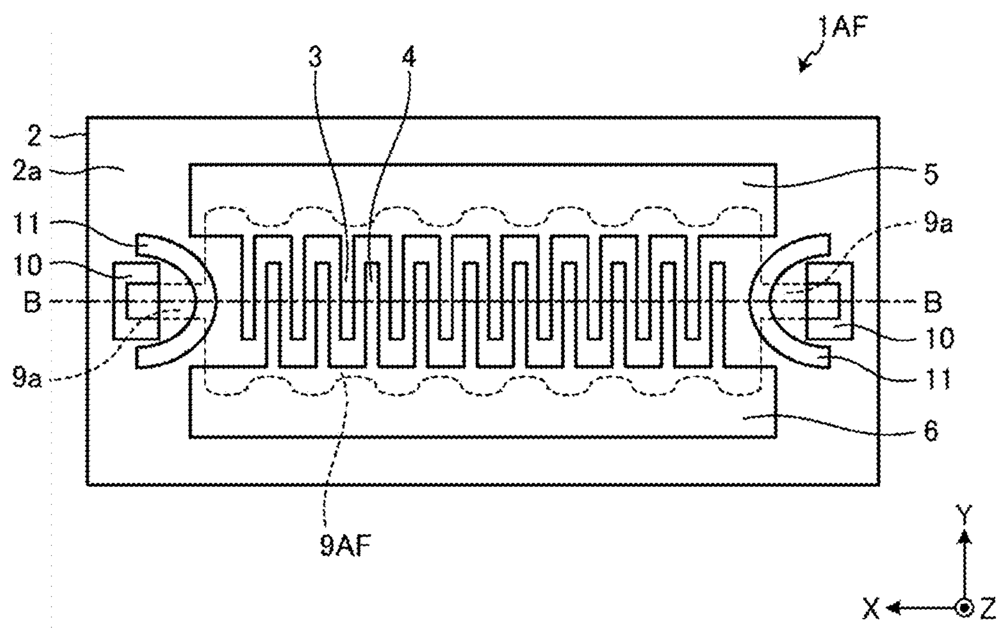
FIG. 31 is a plan view illustrating Example 19 of the acoustic wave device according to the first preferred embodiment of the present invention.
Figure 32:
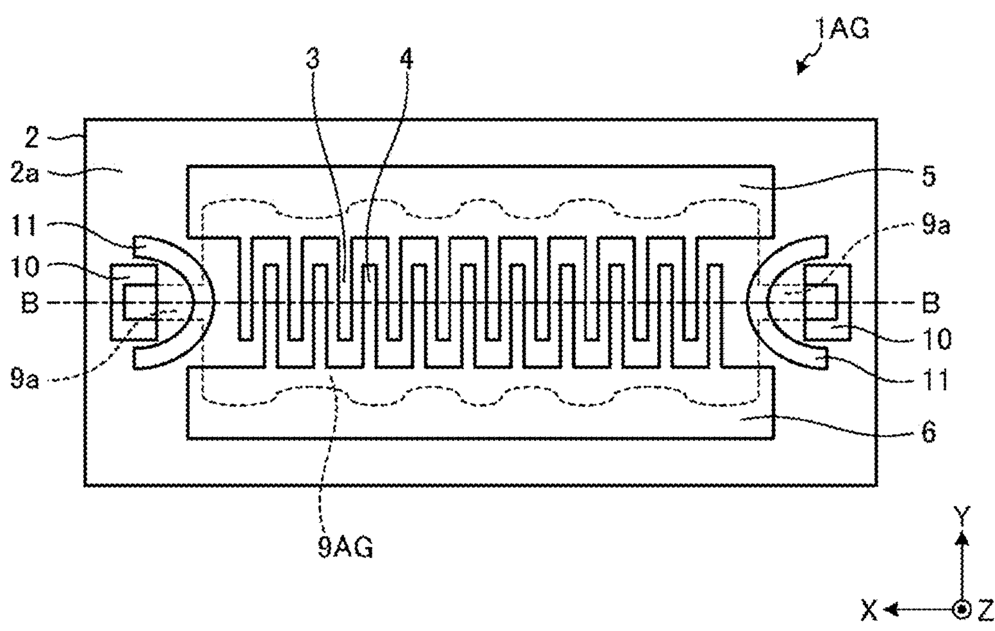
FIG. 32 is a plan view illustrating Example 20 of the acoustic wave device according to the first preferred embodiment of the present invention.
Figure 33:
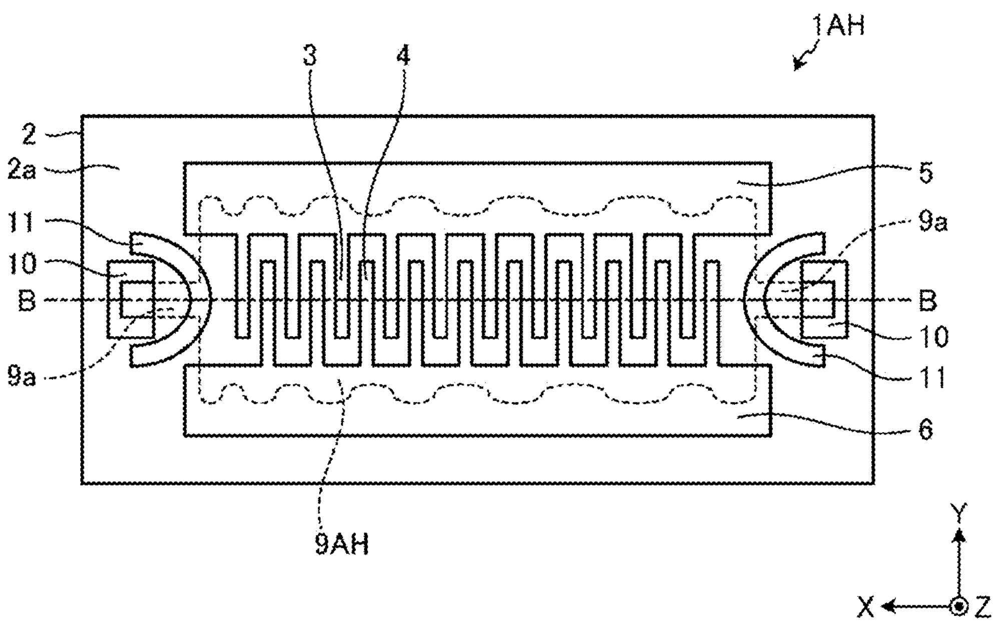
FIG. 33 is a plan view illustrating Example 21 of the acoustic wave device according to the first preferred embodiment of the present invention.
Figure 34:
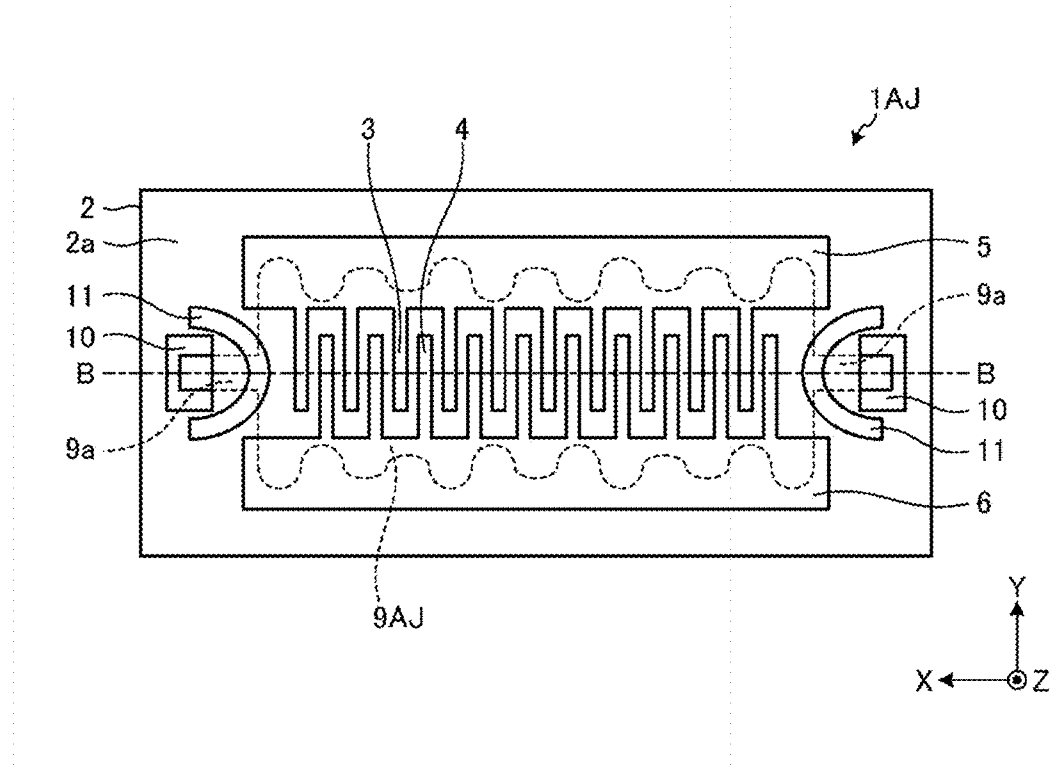
FIG. 34 is a plan view illustrating Example 22 of the acoustic wave device according to the first preferred embodiment of the present invention.

FIG. 31 is a plan view illustrating Example 19 of the acoustic wave device according to the first preferred embodiment. FIG. 32 is a plan view illustrating Example 20 of the acoustic wave device according to the first preferred embodiment. FIG. 33 is a plan view illustrating Example 21 of the acoustic wave device according to the first preferred embodiment. FIG. 34 is a plan view illustrating Example 22 of the acoustic wave device according to the first preferred embodiment. As illustrated in FIG. 31, the inner walls of the end portions of the hollow 9AF in the Y direction may be in the shape of waves defined by elliptical or substantially elliptical arcs connected in series (hereinafter referred to as elliptical waves). Although the inner walls of the end portions of the hollow 9AF in the Y direction are in the shape of waves with a constant wavelength and amplitude in Example 19, the shape is not limited to this. For example, as illustrated in FIG. 32, the inner walls of the end portions of the hollow 9AG in the Y direction may be in the shape of waves with varying wavelengths. In this case, changes in the wavelength of the shape of the inner walls of the end portions of the hollow 9AG in the Y direction do not need to be symmetric with respect to the X direction. As illustrated in FIG. 33, for example, the wavelengths may be reduced in the X direction. As illustrated in FIG. 34, the inner walls of the end portions of the hollow 9AJ in the Y direction may be in the shape of waves with varying amplitudes.

Figure 35:
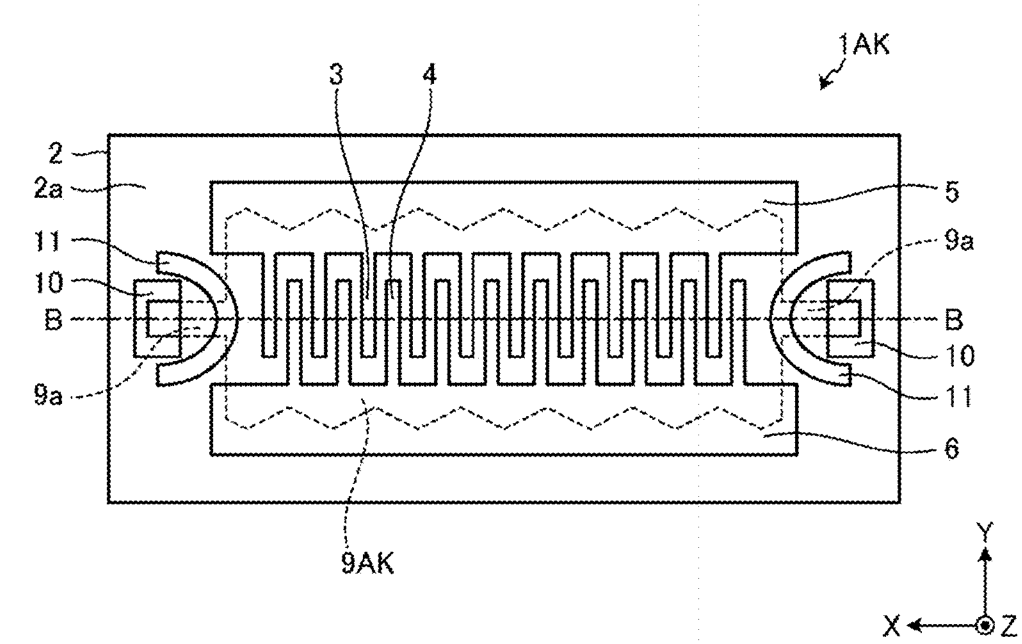
FIG. 35 is a plan view illustrating Example 23 of the acoustic wave device according to the first preferred embodiment of the present invention.
Figure 36:
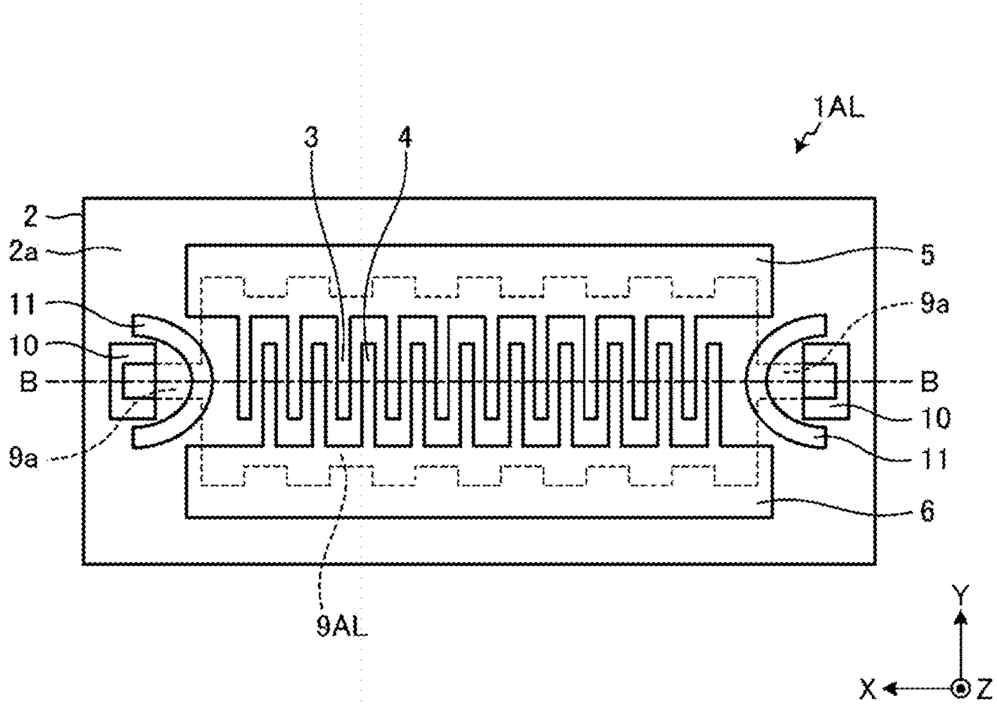
FIG. 36 is a plan view illustrating Example 24 of the acoustic wave device according to the first preferred embodiment of the present invention.
Figure 37:
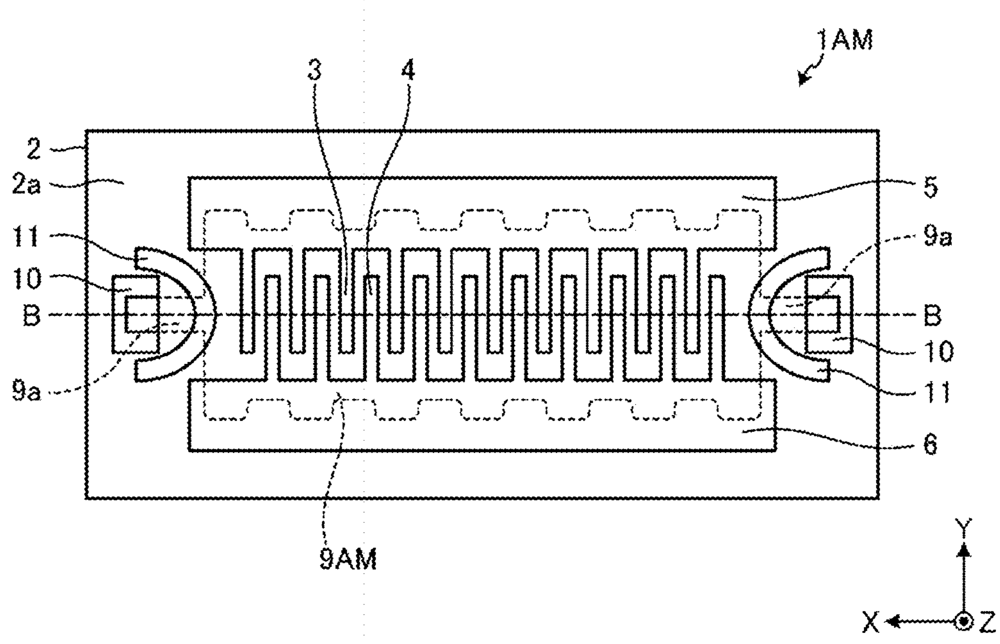
FIG. 37 is a plan view illustrating Example 25 of the acoustic wave device according to the first preferred embodiment of the present invention.

FIG. 35 is a plan view illustrating Example 23 of the acoustic wave device according to the first preferred embodiment. FIG. 36 is a plan view illustrating Example 24 of the acoustic wave device according to the first preferred embodiment. FIG. 37 is a plan view illustrating Example 25 of the acoustic wave device according to the first preferred embodiment. The inner walls of the end portions of the hollow 9 in the Y direction do not need to be in the shape of sine waves or elliptical or substantially elliptical waves. For example, as illustrated in FIG. 35, the inner walls of the end portions of a hollow 9AK in the Y direction may be in the shape of triangular or substantially triangular waves. As illustrated in FIG. 36, the inner walls of the end portions of the hollow 9AL in the Y direction may be in the shape of rectangular or substantially rectangular waves. As illustrated in FIG. 37, the inner walls of the end portions of a hollow

9AM in the Y direction do not need to be in the shape of perfect rectangular waves, but may be in the shape of rectangular waves with rounded corners.

Figure 38:
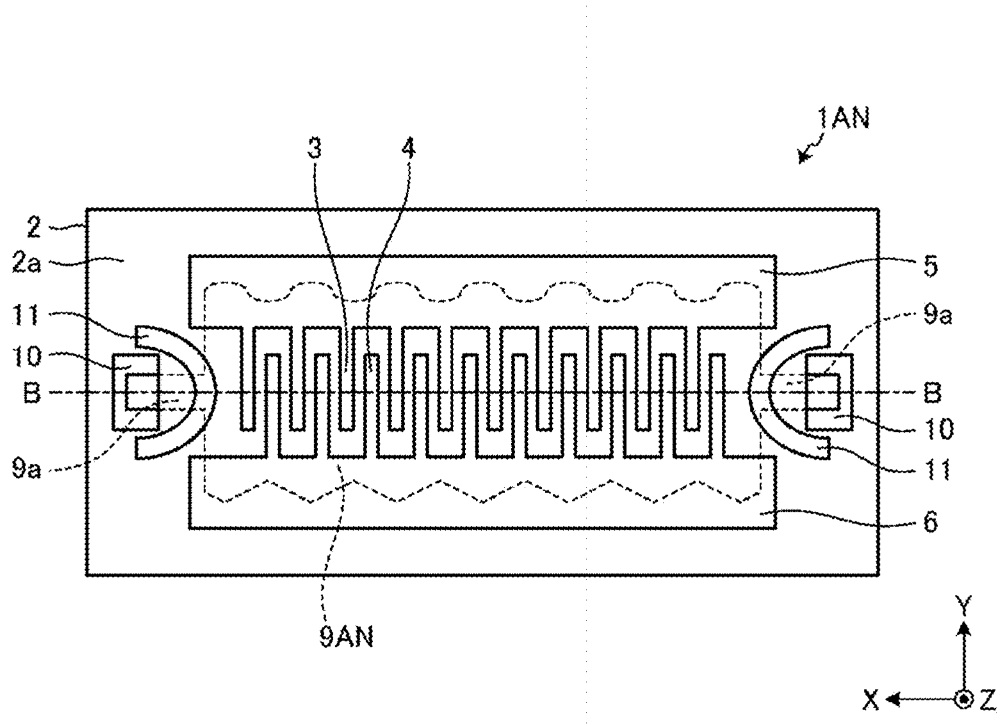
FIG. 38 is a plan view illustrating Example 26 of the acoustic wave device according to the first preferred embodiment of the present invention.
Figure 39:
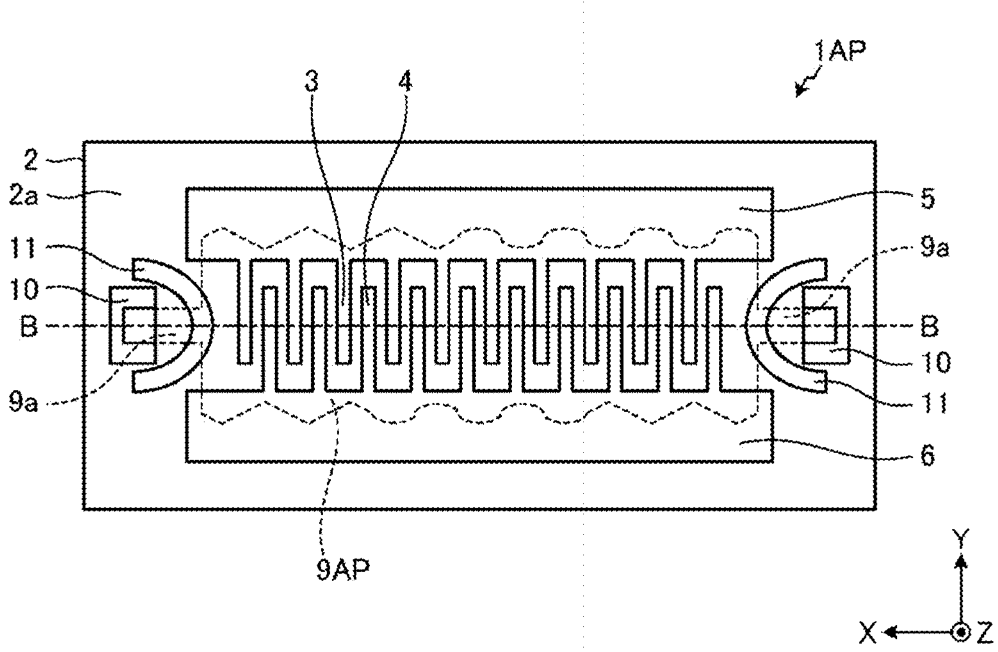
FIG. 39 is a plan view illustrating Example 27 of the acoustic wave device according to the first preferred embodiment of the present invention.

FIG. 38 is a plan view illustrating Example 26 of the acoustic wave device according to the first preferred embodiment. FIG. 39 is a plan view illustrating Example 27 of the acoustic wave device according to the first preferred embodiment. The inner walls of end portions of the hollow 9 in the Y direction may be in the shape of a combination of the waves described above. For example, as illustrated in FIG. 38, the inner walls of two end portions of the hollow 9AN in the Y direction may be in the shape of different waves. In Example 26, one of the inner walls of two end portions of the hollow 9AN in the Y direction is in the shape of elliptical or substantially elliptical waves, and the other of the inner walls is in the shape of triangular or substantially triangular waves. The shape is not limited to this, and any combination of wave shapes may be used. As illustrated in FIG. 39, the inner walls of the end portions of the hollow 9AP in the Y direction may be in the shape of waves provided by connecting waves of different shapes in the X direction. Although the inner walls of end portions of the hollow 9AP in the Y direction is in the shape of waves provided by connecting triangular or substantially triangular waves to elliptical or substantially elliptical waves in Example 27, the shape is not limited to this. Any wave shapes may be connected at any position.

Figure 40:
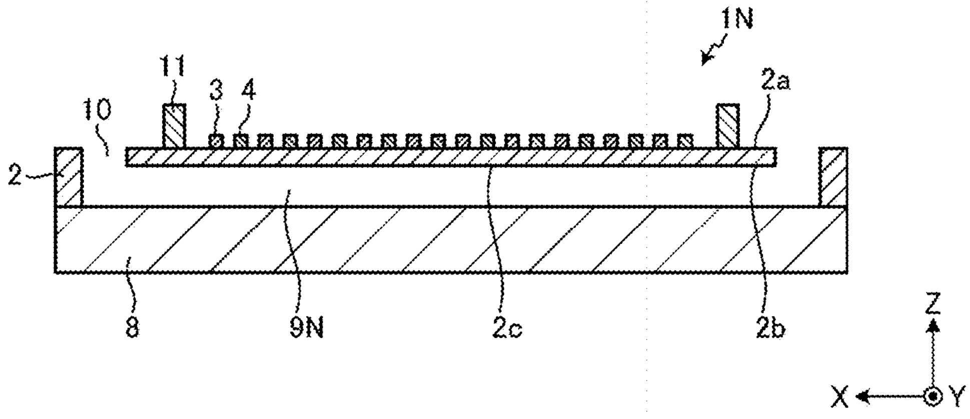
FIG. 40 is a cross-sectional view illustrating Example 28 of the acoustic wave device according to the first preferred embodiment of the present invention.
Figure 41:
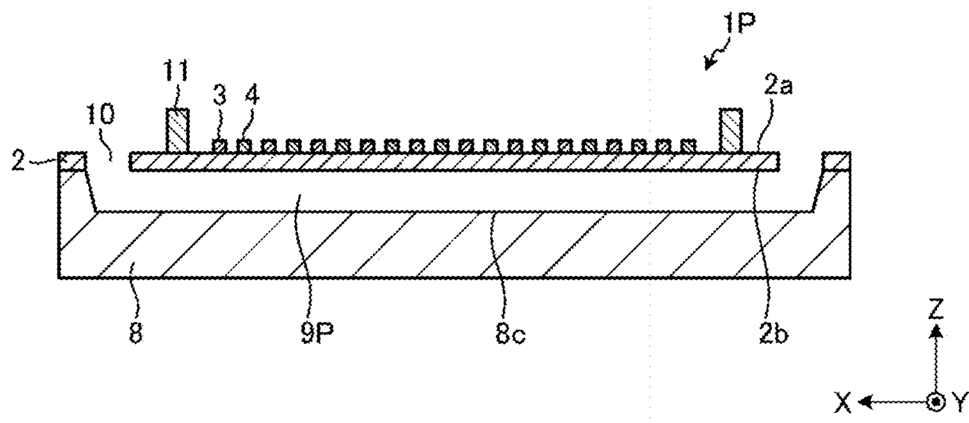
FIG. 41 is a cross-sectional view illustrating Example 29 of the acoustic wave device according to the first preferred embodiment of the present invention.

FIG. 40 is a cross-sectional view illustrating Example 28 of the acoustic wave device according to the first preferred embodiment. FIG. 41 is a cross-sectional view illustrating Example 29 of the acoustic wave device according to the first preferred embodiment. As illustrated in FIG. 40 and FIG. 41, the dielectric film 7 is optional for the acoustic wave device 1.

When the acoustic wave device 1 does not include the dielectric film 7, the hollow 9 may be provided in the piezoelectric layer 2 or the support substrate 8. That is, as illustrated in FIG. 40, a hollow 9N may be a space surrounded by a recess 2*c* in the second principal surface 2*b* of the piezoelectric layer 2 and the surface of the support substrate 8 adjacent to the piezoelectric layer 2. As illustrated in FIG. 41, a hollow 9P may be a space surrounded by the second principal surface 2*b* of the piezoelectric layer 2 and a recess 8*c* in the surface of the support substrate 8 adjacent to the piezoelectric layer 2.

As described above, the acoustic wave device 1A according to the first preferred embodiment includes the support substrate 8 having a thickness in the first direction, the piezoelectric layer 2 on the support substrate 8, the interdigital transducer electrode on the piezoelectric layer 2 and including the plurality of first electrode fingers 3 and the plurality of second electrode fingers 4, the plurality of first electrode fingers 3 extending in the second direction crossing the first direction, the plurality of second electrode fingers 4 extending in the second direction and facing corresponding ones of the plurality of first electrode fingers 3 in the third direction orthogonal or substantially orthogonal to the second direction, and the reinforcing film 11 provided in the first direction of the piezoelectric layer 2 at a position not overlapping the plurality of first and second electrode fingers 3 and 4 in the first direction. The support substrate 8 and the piezoelectric layer 2 include the hollow 9 therebetween at a position at least partially overlapping the interdigital transducer electrode in the first direction. At least one through hole 10 penetrates the piezoelectric layer 2 at a position not overlapping the interdigital transducer electrode in the first direction. The through hole 10 communicates with the hollow 9. The reinforcing film 11 at least partially overlaps the hollow 9 in the first direction.

In the acoustic wave device 1A according to the first preferred embodiment, the reinforcing film 11 extends across the inner wall of the hollow 9 in a plan view from the first direction.

In the acoustic wave device 1A according to the first preferred embodiment, the thickness da of the reinforcing film 11 is greater than or equal to half the thickness d of the piezoelectric layer 2 in the region overlapping the hollow 9 in the Z direction.

With the configuration described above, the region of the piezoelectric layer 2 overlapping the hollow 9 in the first direction is reinforced by the reinforcing film 11 overlapping the hollow 9. The acoustic wave device 1A according to the first preferred embodiment thus can reduce or prevent the occurrence of cracks in the piezoelectric layer 2.

In the acoustic wave device 1A according to the first preferred embodiment, the material of the reinforcing film 11 preferably includes a metal. The resulting high thermal conductivity of the reinforcing film 11 can improve heat dispersion performance of the acoustic wave device.

In the acoustic wave device 1A according to the first preferred embodiment, the material of the reinforcing film 11 may include at least one of silicon oxide, silicon nitride, and alumina.

In the acoustic wave device 1A according to the first preferred embodiment, the reinforcing film 11 at least partially overlaps the region between the through hole 10 and the interdigital transducer electrode in the first direction. This can reduce or prevent the occurrence of cracks in the piezoelectric layer 2 originating from the through hole 10.

In the acoustic wave device 1A according to the first preferred embodiment, the shape of the reinforcing film 11 includes a curve bulging towards the interdigital transducer electrode in a plan view from the first direction. With this shape, the reinforcing film 11 can reduce or prevent unwanted reflective waves from being reflected to the interdigital transducer electrode and can reduce or prevent spurious emission.

In the acoustic wave device 1A according to the first preferred embodiment, the hollow 9 includes the extended passage 9*a* smaller in area than the region of the hollow 9 overlapping the interdigital transducer electrode in the first direction.

In the acoustic wave device 1A according to the first preferred embodiment, the reinforcing film 11 preferably overlaps at least a portion of a boundary between the extended passage 9*a* and the region of the hollow 9 overlapping the interdigital transducer electrode in the first direction. With this configuration, the reinforcing film 11 can reduce or prevent the occurrence of cracks in the piezoelectric layer 2 originating from the boundary.

In an acoustic wave device 1J according to the first preferred embodiment, the hollow 9 may further include the tapered region 9*b* to connect the region overlapping the interdigital transducer electrode in the first direction to the extended passage 9*a* and having a width in the second direction. The width of the tapered region 9*b* decreases towards the extended passage 9*a* in the third direction. The reinforcing film 11 is preferably disposed to overlap at least a portion of the tapered region 9*b*. The reinforcing film 11 can thus reduce or prevent the occurrence of cracks in the piezoelectric layer 2 originating from the tapered region 9*b*.

The acoustic wave device 1A according to the first preferred embodiment further includes the first busbar 5 to electrically connect the plurality of first electrode fingers 3, and the second busbar 6 to electrically connect the plurality of second electrode fingers 4.

In an acoustic wave device 1F according to the first preferred embodiment, at least one reinforcing film 11 is connected to one of the first busbar 5 and the second busbar 6 in the second direction, and insulated from the other of the first busbar 5 and the second busbar 6. This can reinforce the piezoelectric layer 2 while preventing the first busbar 5 and the second busbar 6 from being short-circuited.

In a preferred embodiment of the present invention, a plurality of through holes 10 are provided on both sides of the interdigital transducer electrode, and the plurality of through holes 10 communicate with each other through the hollow 9. This can facilitate manufacturing of the acoustic wave device 1A.

In a preferred embodiment of the present invention, the thickness of the piezoelectric layer 2 is less than or equal to 2p, where p is a center-to-center distance between adjacent first and second electrode fingers 3 and 4 of the plurality of first and second electrode fingers 3 and 4. This can reduce the size of the acoustic wave device 1 and improve the Q factor.

In a preferred embodiment of the present invention the material of the piezoelectric layer 2 includes lithium niobate or lithium tantalate. This makes it possible to provide an acoustic wave device having good resonance characteristics.

In a preferred embodiment of the present invention, Euler angles (φ, θ, ψ) of lithium niobate or lithium tantalate of the piezoelectric layer 2 are in the range defined by numerical expression (1), numerical expression (2), or numerical expression (3) described below. This can sufficiently widen the fractional bandwidth.

$$(0°\pm10°,\ 0° \text{ to } 20°,\ \text{any } \psi) \quad (1)$$

$$(0°\pm10°,\ 20° \text{ to } 80°,\ 0° \text{ to } 60°(1-(\theta-50)^2/900)^{1/2}) \text{ or } (0°\pm10°,\ 20° \text{ to } 80°,\ [180°-60°(1-(\theta-50)^2/900)^{1/2}] \text{ to } 180°) \quad (2)$$

$$(0°\pm10°,\ [180°-30°(1-(\psi-90)^2/8100)^{1/2}] \text{ to } 180°,\ \text{any } \psi) \quad (3)$$

In a preferred embodiment of the present invention, the acoustic wave device 1 is configured to be capable of using thickness shear mode bulk waves. This improves the coupling coefficient and makes it possible to provide an acoustic wave device having good resonance characteristics.

In a preferred embodiment of the present invention, d/p about 0.5 is satisfied, where d is the thickness of the piezoelectric layer 2 and p is the center-to-center distance between adjacent first and second electrode fingers 3 and 4 of the plurality of first and second electrode fingers. This can reduce the size of the acoustic wave device 1 and improve the Q factor.

In a preferred embodiment of the present invention, d/p is less than or equal to about 0.24. This can reduce the size of the acoustic wave device 1 and improve the Q factor.

In a preferred embodiment of the present invention, when a region where adjacent electrode fingers 3 and 4 overlap in a direction in which the adjacent electrode fingers 3 and 4 face each other is the excitation region C, MR≤about 1.75 (d/p)+0.075 is satisfied, where MR is the metallization ratio of the first and second electrode fingers 3 and 4 to the excitation region C. This can reliably make the fractional bandwidth less than or equal to about 17%.

In a preferred embodiment of the present invention, the acoustic wave device 1 is configured to be capable of using plate waves. This makes it possible to provide an acoustic wave device having good resonance characteristics.

Second Preferred Embodiment

Figure 42:
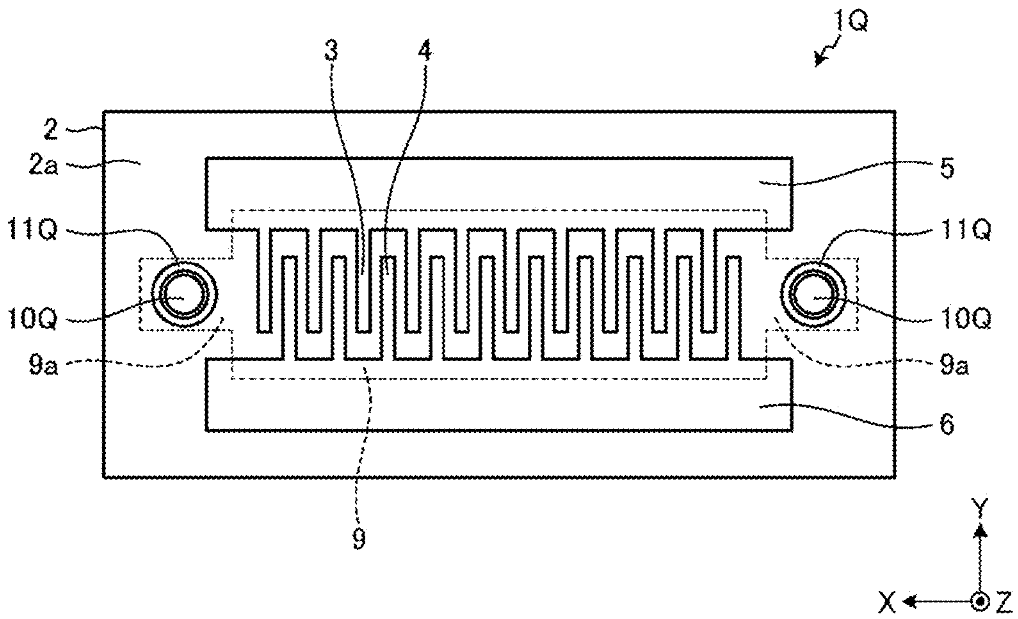
FIG. 42 is a plan view illustrating Example 1 of an acoustic wave device according to a second preferred embodiment of the present invention.

FIG. 42 is a plan view illustrating Example 1 of an acoustic wave device according to a second preferred embodiment of the present invention. An acoustic wave device 1Q according to the second preferred embodiment differs from the first preferred embodiment in that the reinforcing film 11 surrounds the through hole 10. In the second preferred embodiment, the same or corresponding components as those in the first preferred embodiment are denoted by the same reference numerals and their description will be omitted.

A through hole 10Q according to the second preferred embodiment overlaps the hollow 9 in plan view in the Z direction. In Example 1, the entire or substantially the entire through hole 10Q overlaps the hollow 9. The through hole 10Q is circular or substantially circular in plan view in the Z direction in Example 1, but this is merely an example.

In the second preferred embodiment, the reinforcing film 11Q surrounds the through hole 10Q in plan view in the Z direction. In this case, in plan view in the Z direction, the reinforcing film 11Q preferably does not overlap a region at a distance of, for example, less than or equal to about 5 μm from the region of the first principal surface 2*a* of the piezoelectric layer 2 occupied by the through hole 10Q. In Example 1, the reinforcing film 11Q has an annular shape along the shape of the through hole 10Q in plan view in the Z direction. The reinforcing film 11Q can thus reduce or prevent deformation of a region of the piezoelectric layer 2 around the through hole 10Q susceptible to deformation, and can reduce or prevent the occurrence of cracks in the piezoelectric layer 2.

Figure 43:
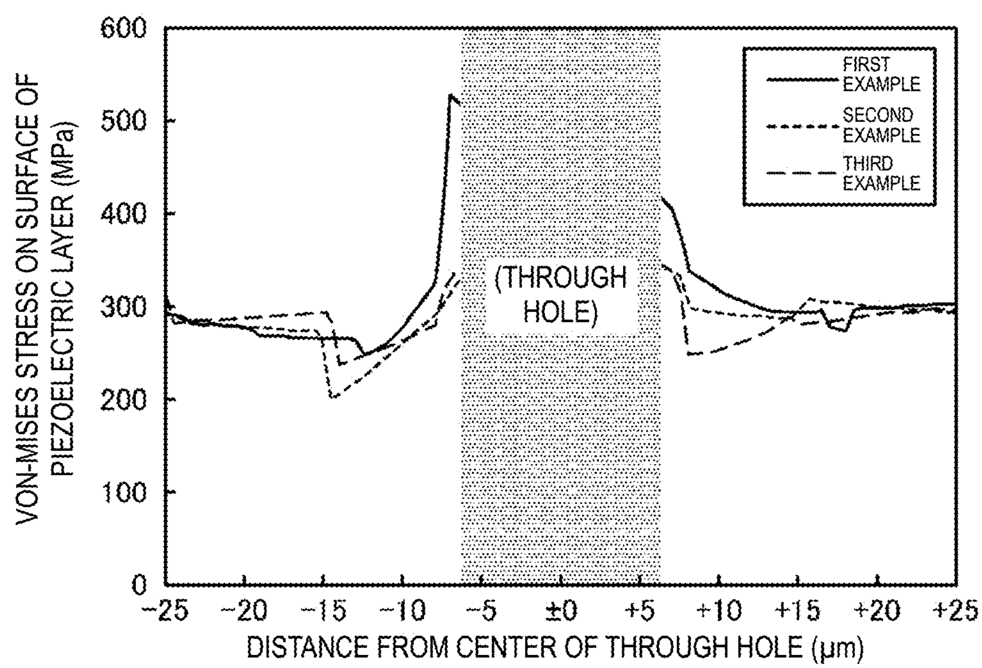
FIG. 43 is an explanatory diagram illustrating stress characteristics of the surface of the piezoelectric layer around a through hole in Example 1 of the acoustic wave device according to the second preferred embodiment of the present invention.

FIG. 43 is an explanatory diagram illustrating stress characteristics of the surface of the piezoelectric layer around the through hole in Example 1 of the acoustic wave device according to the second preferred embodiment. The design parameters for the through hole 10Q and the reinforcing film 11Q of first to third examples having the stress characteristics illustrated in FIG. 43 are as follows.

The first example is a comparative example and does not include the reinforcing film 11Q. The through hole 10Q is about 15 μm in diameter.

The second example is Example and includes the reinforcing film 11Q which is a about 0.50-μm thick silicon oxide film. The reinforcing film 11Q is about 15 μm in inside diameter, and is 30 μm in outside diameter. The through hole 10Q is about 15 μm in diameter.

The third example is Example and includes the reinforcing film 11Q which is a about 0.75 μm-thick silicon oxide film. The reinforcing film 11Q is about 15 μm in inside diameter, and is 50 μm in outside diameter. The through hole 10Q is about 15 μm in diameter.

As is obvious from FIG. 43, the second and third examples (Examples), which include the reinforcing film 11Q, can more effectively reduce or prevent stress concentration around the through hole 10Q in the surface of the piezoelectric layer 2, than the first example (comparative example).

The acoustic wave device according to the second preferred embodiment is not limited to that illustrated in FIG. 42. Other Examples will now be described using drawings.

Figure 44:
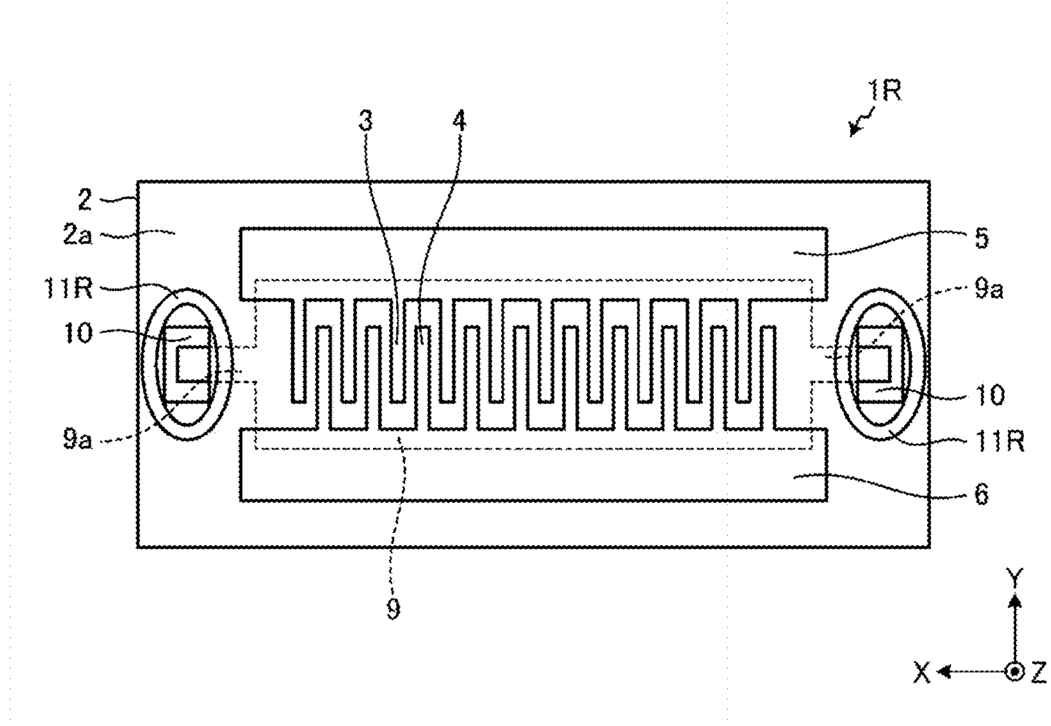
FIG. 44 is a plan view illustrating Example 2 of the acoustic wave device according to the second preferred embodiment of the present invention.

FIG. 44 is a plan view illustrating Example 2 of the acoustic wave device according to the second preferred embodiment. As illustrated in FIG. 44, the through hole 10 may partially overlap the hollow 9, as in the first preferred embodiment. Although a reinforcing film 11R has an annular shape in Example 2, the shape is not limited to this. For example, the reinforcing film 11R may have a frame shape conforming to the shape of the through hole 10.

Figure 45:
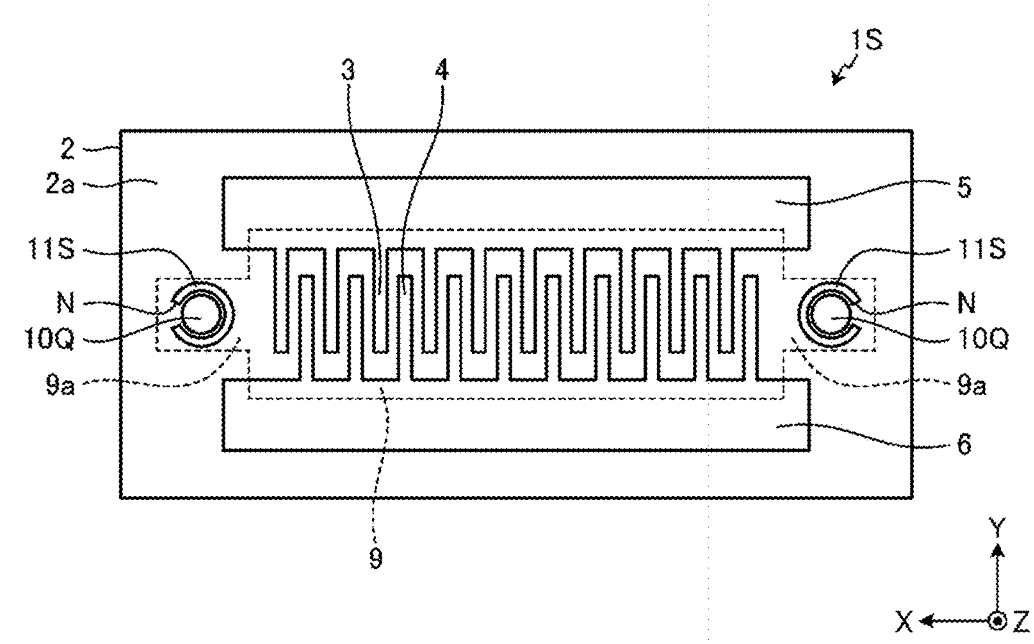
FIG. 45 is a plan view illustrating Example 3 of the acoustic wave device according to the second preferred embodiment of the present invention.

FIG. 45 is a plan view illustrating Example 3 of the acoustic wave device according to the second preferred embodiment. A reinforcing film 11S does not necessarily need to be completely closed and may include a cut N, as illustrated in FIG. 45. In this case, the cut N is preferably located opposite the interdigital transducer with respect to the through hole 10Q. That is, in FIG. 45, the reinforcing film 11S includes the cut N distant from the interdigital transducer electrode in the X direction. The reinforcing film 11S can thus prevent deformation of a region of the piezoelectric layer 2 around the through hole 10Q susceptible to deformation, and can reduce or prevent the occurrence of cracks in the piezoelectric layer 2.

Figure 46:
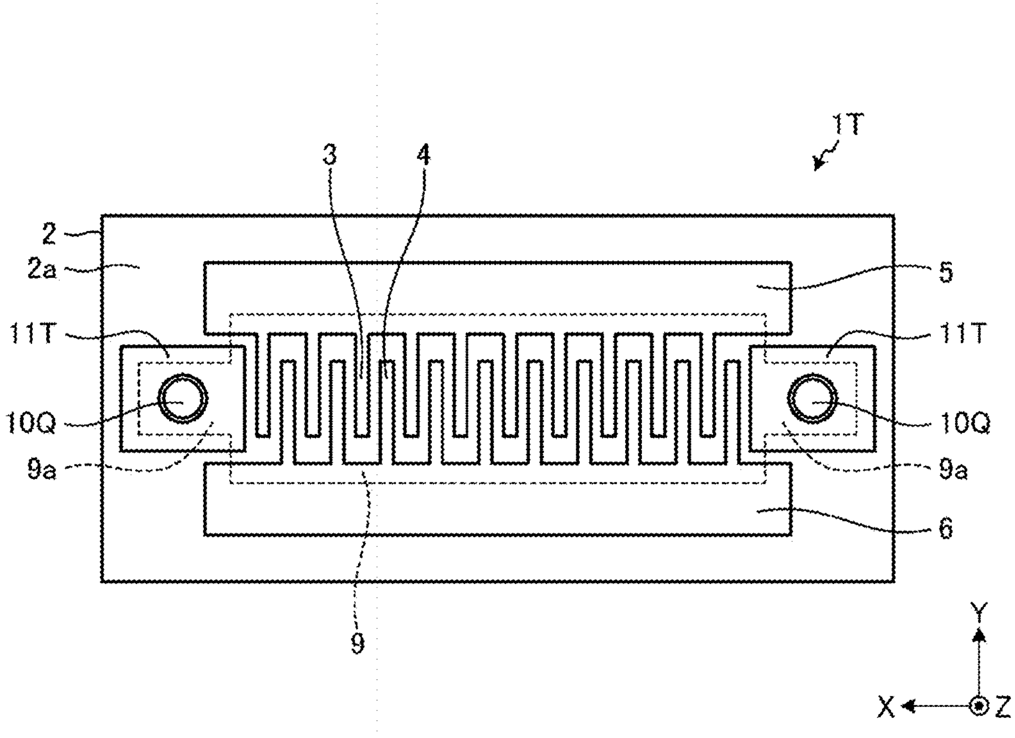
FIG. 46 is a plan view illustrating Example 4 of the acoustic wave device according to the second preferred embodiment.

FIG. 46 is a plan view illustrating Example 4 of the acoustic wave device according to the second preferred embodiment. As illustrated in FIG. 46, a reinforcing film 11T may cover the entire or substantially the entire inner wall of the extended passage 9*a*. In this case, the reinforcing film 11T preferably does not overlap a region at a distance of less than or equal to about 5 μm from the region of the first principal surface 2*a* of the piezoelectric layer 2 occupied by the through hole 10Q, the electrode fingers 3 and 4, or the busbars 5 and 6 in plan view in the Z direction. This makes the coating state of the piezoelectric layer 2 around the through hole 10Q close to the coating state of the region overlapping the interdigital transducer electrode, and can thus reduce or prevent deformation of the hollow 9 and the occurrence of cracks in the piezoelectric layer 2.

Figure 47:
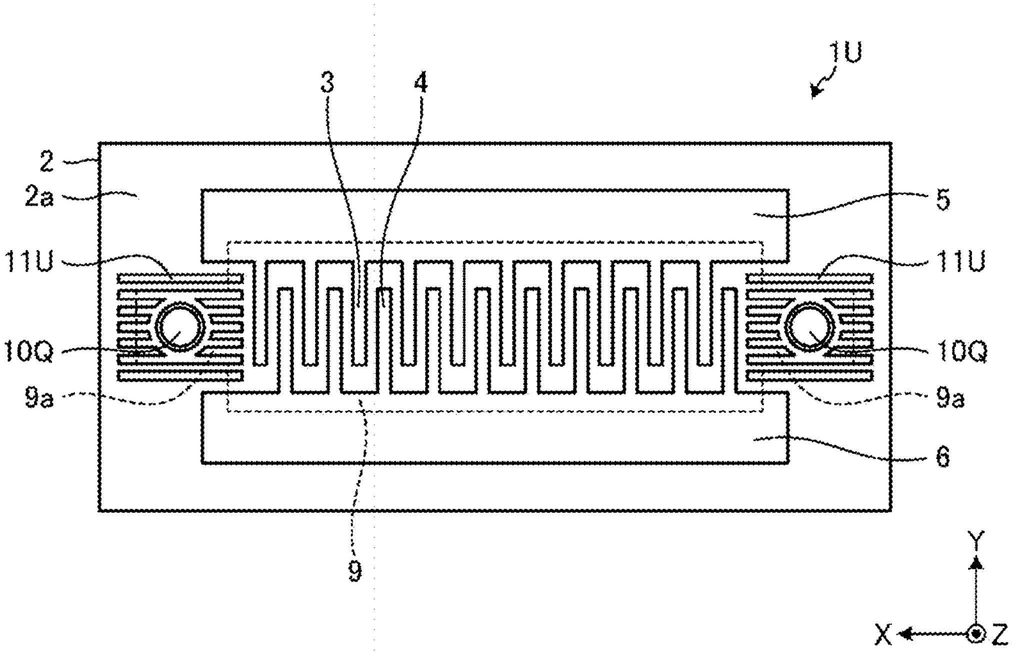
FIG. 47 is a plan view illustrating Example 5 of the acoustic wave device according to the second preferred embodiment of the present invention.
Figure 48:
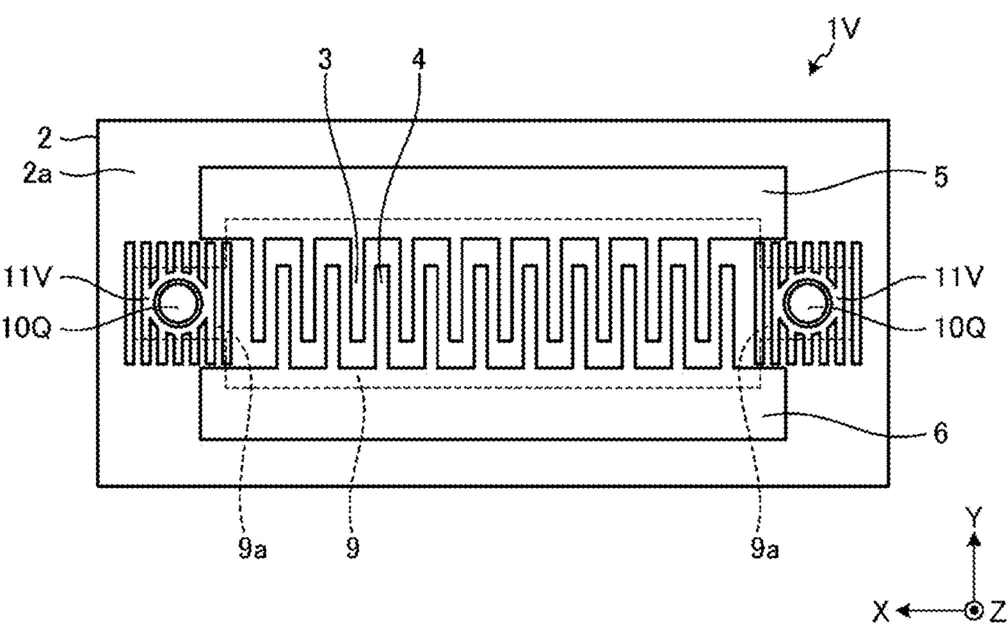
FIG. 48 is a plan view illustrating Example 6 of the acoustic wave device according to the second preferred embodiment of the present invention.
Figure 49:
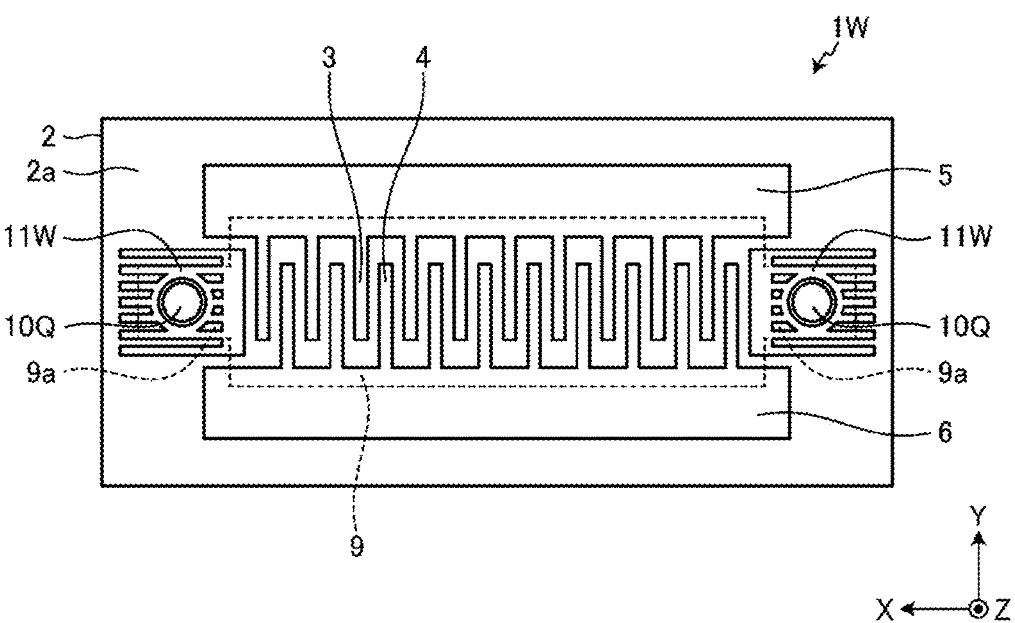
FIG. 49 is a plan view illustrating Example 8 of the acoustic wave device according to the second preferred embodiment of the present invention.

FIG. 47 is a plan view illustrating Example 5 of the acoustic wave device according to the second preferred embodiment. FIG. 48 is a plan view illustrating Example 6 of the acoustic wave device according to the second preferred embodiment. FIG. 49 is a plan view illustrating Example 8 of the acoustic wave device according to the second preferred embodiment. As illustrated in FIG. 47, the reinforcing film 11U may be provided with slits outside a region around the through hole 10Q. Although the direction of slits in a reinforcing film 11U is parallel or substantially parallel to the X direction, the configuration is not limited to this. As illustrated in FIG. 48, slits in a reinforcing film 11V may be parallel or substantially parallel to the Y direction. When the direction of slits is parallel or substantially parallel to the X direction as illustrated in FIG. 47, a reinforcing film 11W may have a rectangular or substantially rectangular reinforcing film covering the boundary as illustrated in FIG. 49. The direction of slits is not limited to those illustrated in FIG. 47 to FIG. 49, and the slits may extend in any direction.

Figure 50:
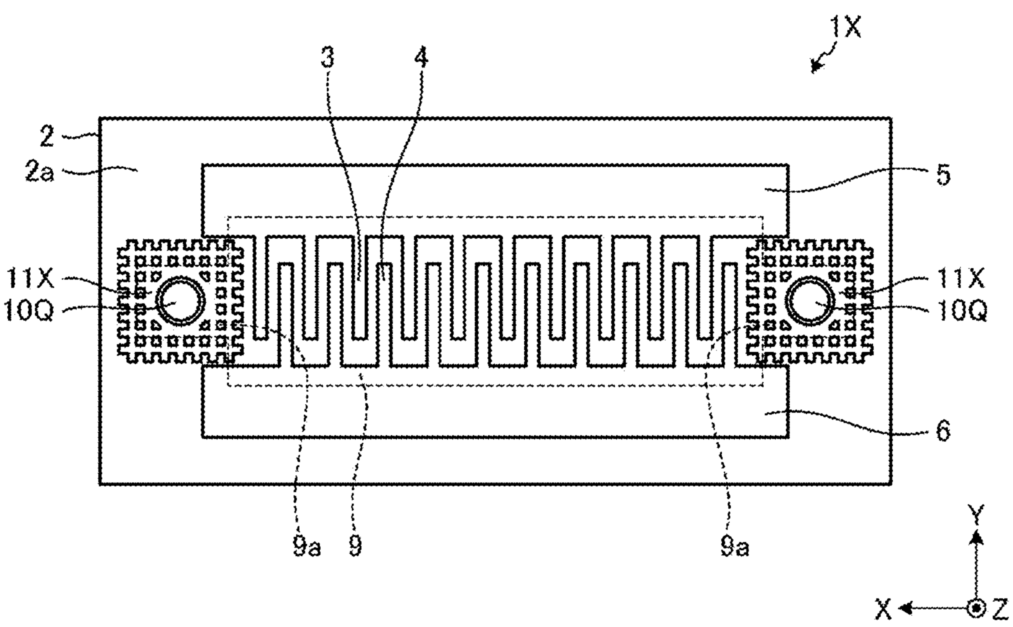
FIG. 50 is a plan view illustrating Example 9 of the acoustic wave device according to the second preferred embodiment of the present invention.

FIG. 50 is a plan view illustrating Example 9 of the acoustic wave device according to the second preferred embodiment. As illustrated in FIG. 50, the reinforcing film 11X may include a mesh area outside a region around the through hole 10Q. The direction and pattern of the mesh illustrated in FIG. 50 are merely an example, and the mesh may have any direction and pattern.

Figure 51:
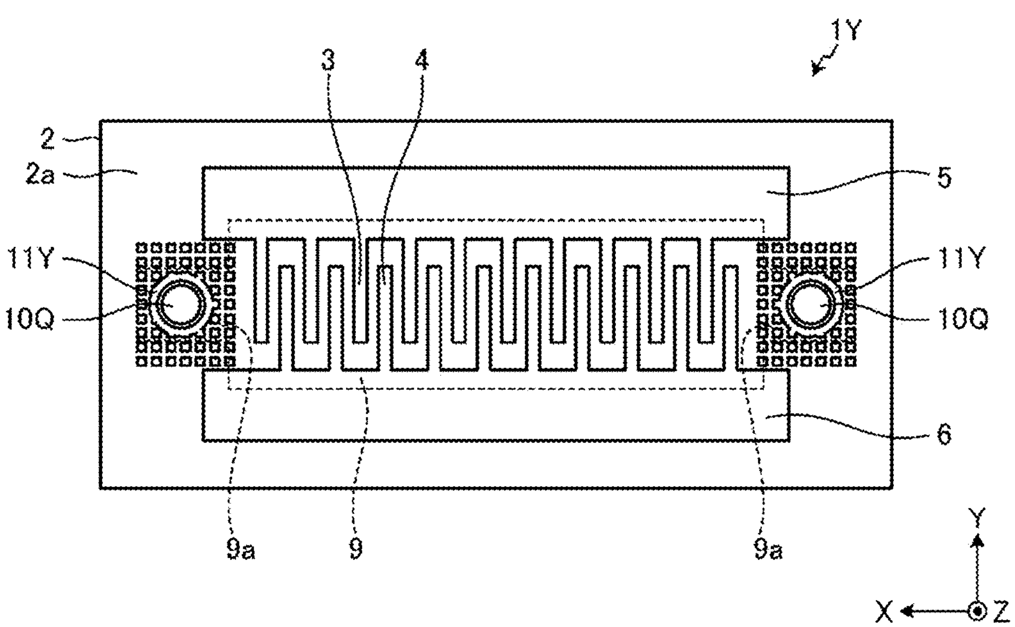
FIG. 51 is a plan view illustrating Example 10 of the acoustic wave device according to the second preferred embodiment of the present invention.

FIG. 51 is a plan view illustrating Example 10 of the acoustic wave device according to the second preferred embodiment. As illustrated in FIG. 51, the reinforcing film 11Y may have a dot pattern outside a region around the through hole 10Q. Although the reinforcing film 11Y includes rectangular or substantially rectangular dots arranged in the X and Y directions in the example illustrated in FIG. 51, this is merely an example and the dots may have any shape and arrangement.

As described above, in the acoustic wave device 1Q according to the second preferred embodiment, the reinforcing film 11Q surrounds the through hole 10Q in plan view in the first direction. The reinforcing film 11Q can thus reduce or prevent deformation of a region of the piezoelectric layer 2 around the through hole 10Q susceptible to deformation, and can reduce or prevent the occurrence of cracks in the piezoelectric layer 2.

In an acoustic wave device 1U according to the second preferred embodiment, the shape of the reinforcing film 11U includes a slit structure in plan view in the first direction. This makes the coating state of the piezoelectric layer 2 around the through hole 1010Q close to the coating state of the region overlapping the interdigital transducer electrode, and can thus reduce or prevent deformation of the hollow 9 and the occurrence of cracks in the piezoelectric layer 2.

In an acoustic wave device 1X according to the second preferred embodiment, the shape of a reinforcing film 11X includes a mesh structure in plan view in the first direction. This makes the coating state of the piezoelectric layer 2 around the through hole 10Q close to the coating state of the region overlapping the interdigital transducer electrode, and can thus reduce or prevent deformation of the hollow 9 and the occurrence of cracks in the piezoelectric layer 2.

In an acoustic wave device 1Y according to the second preferred embodiment, the shape of a reinforcing film 11Y includes a structure with a pattern defined by pieces of the reinforcing film in plan view in the first direction. This makes the coating state of the piezoelectric layer 2 around the through hole 10Q close to the coating state of the region overlapping the interdigital transducer electrode, and can thus reduce or prevent deformation of the hollow 9 and the occurrence of cracks in the piezoelectric layer 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support substrate having a thickness in a first direction;

a piezoelectric layer on the support substrate;

an interdigital transducer electrode on the piezoelectric layer and including a plurality of first electrode fingers and a plurality of second electrode fingers, the plurality of first electrode fingers extending in a second direction crossing the first direction, the plurality of second electrode fingers extending in the second direction and facing corresponding ones of the plurality of first electrode fingers in a third direction orthogonal or substantially orthogonal to the second direction; and a reinforcing film on the piezoelectric layer; wherein the support substrate and the piezoelectric layer include a hollow therebetween at a position at least partially overlapping the interdigital transducer electrode in the first direction;

at least one through hole penetrates the piezoelectric layer at a position not overlapping the interdigital transducer electrode in the first direction, and the through hole communicates with the hollow; and the reinforcing film at least partially overlaps the hollow in the first direction.

2. The acoustic wave device according to claim 1, wherein the reinforcing film extends across an inner wall of the hollow in a plan view from the first direction.

3. The acoustic wave device according to claim 1, wherein a thickness of the reinforcing film is greater than or equal to about one half of a thickness of the piezoelectric layer in a region overlapping the hollow in the first direction.

4. The acoustic wave device according to claim 1, wherein a material of the reinforcing film includes a metal.

5. The acoustic wave device according to claim 1, wherein a material of the reinforcing film includes at least one of silicon oxide, silicon nitride, or alumina.

6. The acoustic wave device according to claim 1, wherein the reinforcing film at least partially overlaps a region between the through hole and the interdigital transducer electrode in the first direction.

7. The acoustic wave device according to claim 6, wherein a shape of the reinforcing film includes a curve bulging towards the interdigital transducer electrode in a plan view from the first direction.

8. The acoustic wave device according to claim 6, wherein the reinforcing film surrounds the through hole in a plan view from the first direction.

9. The acoustic wave device according to claim 6, wherein a shape of the reinforcing film includes a slit structure in a plan view from the first direction.

10. The acoustic wave device according to claim 6, wherein a shape of the reinforcing film includes a mesh structure in a plan view from the first direction.

11. The acoustic wave device according to claim 6, wherein a shape of the reinforcing film includes a structure including a pattern defined by pieces of the reinforcing film in a plan view from the first direction.

12. The acoustic wave device according to claim 1, wherein the hollow includes an extended passage smaller in area than a region of the hollow overlapping the interdigital transducer electrode in the first direction.

13. The acoustic wave device according to claim 12, wherein the reinforcing film overlaps at least a portion of a boundary between the extended passage and the region of the hollow overlapping the interdigital transducer electrode in the first direction.

14. The acoustic wave device according to claim 12, wherein the hollow further include a tapered region connecting the region overlapping the interdigital transducer electrode in the first direction to the extended passage and having a width in the second direction, the width decreasing toward the extended passage in the third direction; and the reinforcing film overlaps at least a portion of the tapered region.

15. The acoustic wave device according to claim 1, further comprising:

a first busbar to electrically connect the plurality of first electrode fingers; and a second busbar to electrically connect the plurality of second electrode fingers.

16. The acoustic wave device according to claim 15, wherein at least one reinforcing film is connected to one of the first busbar and the second busbar in the second direction, and insulated from another of the first busbar and the second busbar.

17. The acoustic wave device according to claim 1, wherein a plurality of through holes are provided on both sides of the interdigital transducer electrode in the third direction, and the plurality of through holes communicate with each other through the hollow.

18. The acoustic wave device according to claim 1, wherein a thickness of the piezoelectric layer is less than or equal to about 2p, where p is a center-to-center distance between adjacent first and second electrode fingers of the plurality of first and second electrode fingers.

19. The acoustic wave device according to claim 1, wherein a material of the piezoelectric layer includes lithium niobate or lithium tantalate.

20. The acoustic wave device according to claim 15, wherein Euler angles ($\varphi$, $\theta$, $\psi$) of lithium niobate or lithium tantalate forming the piezoelectric layer are in a range defined by numerical expression (1), numerical expression (2) or numerical expression (3):

$$(0°\pm10°,\ 0° \text{ to } 20°,\ \text{any } \psi) \quad (1);$$

$$(0°\pm10°,\ 20° \text{ to } 80°,\ 0° \text{ to } 60°(1-(\theta-50)^2/900)^{1/2}) \text{ or } (0°\pm10°,\ 20° \text{ to } 80°,\ [180°-60°(1-(\theta-50)^2/900)^{1/2}] \text{ to } 180°) \quad (2); \text{ and}$$

$$(0°\pm10°,\ [180°-30°(1-(\psi-90)^2/8100)^{1/2}] \text{ to } 180°,\ \text{any } \psi) \quad (3).$$

21. The acoustic wave device according to claim 19, wherein the acoustic wave device is operable to generate thickness shear mode bulk waves.

22. The acoustic wave device according to claim 21, wherein $d/p \leq$ about 0.5 is satisfied, where d is a thickness of the piezoelectric layer and p is a center-to-center distance between adjacent first and second electrode fingers.

23. The acoustic wave device according to claim 22, wherein d/p is less than or equal to about 0.24.

24. The acoustic wave device according to claim 22, wherein when a region where adjacent electrode fingers overlap in a direction in which the adjacent electrode fingers face each other is an excitation region, $MR \leq$ about $1.75(d/p)+0.075$ is satisfied, where MR is a metallization ratio of the plurality of electrode fingers to the excitation region.

25. The acoustic wave device according to claim 1, wherein the acoustic wave device is operable to generate plate waves.

* * * * *